United States Patent
Watanabe et al.

(10) Patent No.: US 6,654,107 B1
(45) Date of Patent: Nov. 25, 2003

(54) STEPPER LENS ABERRATION MEASUREMENT PATTERN AND STEPPER LENS ABERRATION CHARACTERISTICS EVALUATING METHOD

(75) Inventors: Akira Watanabe, Tokyo (JP); Akihiko Nara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,854

(22) Filed: Mar. 17, 2000

(30) Foreign Application Priority Data

Sep. 3, 1999 (JP) .......................... 11-250468

(51) Int. Cl.$^7$ .............................. G01B 9/00; G03F 9/00
(52) U.S. Cl. ........................................ 356/124; 430/5
(58) Field of Search .................... 356/400, 401, 356/124; 430/22, 30, 5

(56) References Cited

U.S. PATENT DOCUMENTS

| | | | | |
|---|---|---|---|---|
| 5,328,807 A | * | 7/1994 | Tanaka et al. | 430/311 |
| 5,615,006 A | | 3/1997 | Hirukawa et al. | |
| 5,856,053 A | | 1/1999 | Watanabe | |
| 5,902,703 A | | 5/1999 | Pierre et al. | |
| 5,976,740 A | * | 11/1999 | Ausschnitt et al. | 430/30 |
| 6,011,611 A | * | 1/2000 | Nomura et al. | 355/67 |
| 6,296,977 B1 | * | 10/2001 | Kaise et al. | 430/30 |

FOREIGN PATENT DOCUMENTS

| | | |
|---|---|---|
| EP | 0 674 342 A1 | 9/1995 |
| JP | 511588 | 4/1995 |
| JP | 11-102061 | 4/1999 |
| JP | 11-184070 | 7/1999 |

* cited by examiner

*Primary Examiner*—Zandra Smith
(74) *Attorney, Agent, or Firm*—Rabin & Berdo, P.C.

(57) ABSTRACT

A line-and-space type first pattern and a roughly rectangular second pattern are joined in a rough comb shape to prepare a joint pattern. The first pattern is constituted of a plurality of line patterns each having a width along the direction of its shorter side set to a dimension that does not allow separation/resolution in the field of view of an optical length measuring machine. The second pattern has external dimensions that allow separation/resolution in the field of view of the optical length measuring machine. Such joint patterns are positioned over a distance that allows separation/resolution in the field of view of the optical length measuring machine from each other with the line portions of the first patterns extending outward and achieving a symmetrical positional relationship with together. This pattern is then transferred and formed onto a wafer using a stepper. In the resulting pattern, the outer edges of the line-and-space portions achieve a linear shape, and measurement using the optical length measuring machine is enabled to make it possible to evaluate aberration components. In addition, since the front end of a line-and-space portion undergoes changes in shape sensitively in response to changes in the exposure condition and aberrations, a measurement method with a high degree of sensitivity is achieved.

12 Claims, 25 Drawing Sheets

FIG.19(b)

exposure shot positions
(lens positions)

| UL | | UR |
|---|---|---|
| | CE | |
| LL | | LR |

↓

0° direction coma aberration (um)

| 0.04 | | 0.01 |
|---|---|---|
| | 0.02 | |
| 0.03 | | 0.01 |

90° direction coma aberration (um)

| 0.04 | | -0.01 |
|---|---|---|
| | 0.01 | |
| 0.03 | | 0.02 |

0°-90° direction astigmatism (um)

| -0.01 | | 0 |
|---|---|---|
| | 0.01 | |
| -0.03 | | 0.01 |

STEPPER LENS ABERRATION MEASUREMENT PATTERN AND STEPPER LENS ABERRATION CHARACTERISTICS EVALUATING METHOD

BACKGROUND OF THE INVENTION

The present invention relates to a pattern configuration to be employed to evaluate the aberration characteristics of a reducing projection lens of a stepper which is utilized to form a pattern on a semiconductor substrate during a photolithography step implemented in a semiconductor device manufacturing process.

During the photolithography step implemented in a semiconductor device manufacturing process, a reducing projection exposure apparatus called a stepper is employed to repeat a step for transferring a circuit pattern formed on a reticle mask onto a semiconductor substrate (hereafter referred to as a wafer) to manufacture a semiconductor device. In the prior art, the aberration characteristics components of the reducing projection lens of the stepper are evaluated in order to ensure that the shape of the circuit pattern is accurately transferred during the photolithography step. Various types of testing and measurement are performed in correspondence to the specific aberration components of the lens during the stepper lens aberration characteristics evaluation.

As an example, coma aberration measurement is explained. If a coma aberration is present, convergence spots become asymmetrical, which causes asymmetry in the transferred pattern. FIG. 20 illustrates a pattern configuration employed in an evaluation in the prior art. It is constituted of a line-and-space pattern achieved by a repeating arrangement of several lines and spaces having a width corresponding to the resolving power of the stepper lens. The width in this context refers to the length of the shorter side of the lines and spaces in the figure. In FIG. 20(a), the widthwise direction extends along the horizontal direction. In FIGS. 20(b), (c) and (d) respectively, the line-and-space pattern is rotated by 90 degrees, 45 degrees in the clockwise direction and 45 degrees in the counterclockwise direction relative to the state illustrated in FIG. 20(a).

In the prior art, this pattern configuration is set at various exposure positions of the lens, as illustrated in FIG. 21, the widths of the outermost patterns in each pattern configuration are measured and the difference in the measured widths is evaluated as the coma aberration at the corresponding exposure position. An outermost pattern refers to a pattern that does not have another pattern lying adjacent to it on its outside within the same pattern configuration. This measurement method is based upon the principle that in line-and-space patterns, the shapes of the edges of patterns having other patterns lying adjacent to them are less likely to be affected by aberrations compared to outermost patterns.

For instance, the pattern configuration shown in FIG. 20(a) is used to ascertain the coma aberration component along the horizontal direction. The dimensions of XL and XR which are the outermost pattern widths among the plurality of lines and spaces transferred and formed on the wafer are measured by using an SEM length measuring machine and then the coma aberration is calculated through:

coma aberration=(XL)−(XR) or coma aberration=((XL)−(XR))/((XL)+(XR)).

This measurement and calculation process is implemented at each exposure position of the lens shown in FIG. 21 to ascertain the coma aberration at each position.

The upper outermost pattern width YU and the lower outermost pattern width YL are measured and their difference is calculated to ascertain the coma aberration component along the vertical direction by using the pattern configuration in FIG. 20(b). Likewise, the pattern widths +45L and +45R are measured and their difference is calculated as the coma aberration component along the diagonal direction extending from the upper left to the lower right by using the pattern configuration in FIG. 20(c). The pattern widths −45L and −45R are measured and their difference is calculated as the coma aberration component along the diagonal direction extending from the upper right to the lower left by using the pattern configuration in FIG. 20(d). Thus, by using the four types of pattern configurations shown in FIG. 20 set at the individual exposure positions and measuring the transferred patterns formed by them, the coma aberrations manifested in the various directions at each exposure position can be evaluated.

Next, as another example of aberration measurement, measurement of astigmatism is explained. If an astigmatism is present, the correct focus position changes in correspondence to the direction in which a pattern is formed. For instance, if the exposure surface is set at the correct focus position for a given transferred pattern, another transferred pattern extending along a direction perpendicular to the first transferred pattern becomes defocused. Thus, the widths of the pre-transfer patterns that are equal to each other become different when they are transferred along two different directions at the exposure surface. Based upon this concept, the dimensional difference between transferred patterns along different directions at a given exposure surface is measured and calculated and then evaluated as the astigmatism.

In more specific terms, the pattern width 0C at the center of the pattern structure in FIG. 20(a) and the pattern width 90C at the center on the pattern structure in FIG. 20(b) are measured and the 0° direction—90° direction astigmatism is calculated and evaluated as:

0°–90° direction astigmatism=(0C)–(90C).

Likewise, 45C in FIG. 20(c) and 135C in FIG. 20(d) are measured and the 45° direction—135° direction astigmatism is calculated and evaluated as:

45 degrees 135 degrees direction astigmatism=(45C)–(135C). As an overall astigmatism quantity, the dimensional difference is calculated through:

astigmatism=MAX ((0C), (90C), (45C)), (135C))–MIN ((0C), (90C), (45C)), (135C))

for each pattern configuration on the same exposure surface by comparing the pattern widths along the 0 degree direction, the 90 degrees direction, the 45 degrees direction and the 135 degrees direction, and the dimensional difference thus ascertained is evaluated as the astigmatism. As in the coma aberration measurement explained earlier, this process of dimensional measurement, comparison and calculation is performed for the pattern configuration at each of the exposure positions set within the lens exposure range, so that the astigmatism can be evaluated in correspondence to each exposure position. The central width in each pattern structure is used in the astigmatism measurement since the edge shapes of patterns adjacent to other patterns are assumed to be affected by coma aberration to a lesser degree compared to outermost patterns.

SUMMARY OF THE INVENTION

In the measuring method using the patterns described above, a coma aberration is calculated by measuring the dimensional difference between the outermost patterns positioned symmetrical to each other. However, even when a pattern is affected by a coma aberration, a dimensional difference does not always manifest itself between the widths of the outermost patterns. FIG. 22(a) is a sectional view of the pattern formed by using the pattern configuration shown in FIG. 20(a). Even when the pattern is affected by an aberration, as illustrated in FIG. 22(a), LE and RI may be very close to each other (LE·RI) and, as a result, no significant dimensional difference may be manifested. In other words, the measuring method in the prior art has a problem in that an aberration component may not be measured accurately.

FIG. 22(b) is a cross section of one of the line patterns that have been formed. The coma aberration manifests itself as a difference between the left and right edge shapes within a given pattern as shown in FIG. 22(b) and should, therefore, be evaluated as the dimensional difference ER−EL. However, since the dimensional difference between the left and right edges of the same pattern is not ascertained in the measuring method in the prior art, there is a problem in that the evaluation is not performed accurately.

In addition, since the evaluation is performed with the pattern size set close to the limit of the resolving power of the stepper in the measurement method employed to measure coma aberration and astigmatism in the prior art, an SEM length measuring machine is employed to measure pattern dimensions. Since an SEM length measuring machine performs measurement at a high magnification factor, it is difficult to measure a plurality of patterns within a given field of view. Thus, it is necessary to repeat the measuring process by moving the measuring position to measure each new pattern. As a result, the aberration evaluation process described earlier, which necessitates numerous patterns to be measured, becomes complicated and time consuming.

An object of the present invention, which has been completed by addressing the problems of the prior art discussed above, is to provide a stepper lens aberration measurement pattern and a stepper lens aberration characteristics evaluating method that make it possible to perform a stepper lens aberration characteristics evaluation with a high degree of sensitivity without requiring a great length of time by employing an optical length measuring machine.

In order to achieve the object described above, in a first aspect of the present invention, a pattern to be used for stepper lens aberration characteristics evaluation includes line-and-space type first patterns, each first pattern constituted of a plurality of line patterns each having a width along the direction of its shorter side set at a dimension that does not allow separation/resolution in the field of view of an optical length measuring machine, roughly rectangular second patterns having external dimensions that allow separation/resolution in the field of view of the optical length measuring machine arranged to provide at least two joint patterns each formed by joining a first pattern and a second pattern so as to roughly resemble a comb, in which the joint patterns are placed over a distance from each other that is set to allow separation/resolution in the field of view of an optical length measuring machine while achieving a positional relationship whereby line portions of their first patterns extending outward are symmetrical to each other, is provided. When this pattern is transferred and formed on a wafer by employing a stepper, the dimensions of the symmetrical portions of the pattern can be measured with the optical length measuring machine so that the coma aberration component of the stepper lens can be evaluated with a high degree of sensitivity through comparison/calculation.

It is to be noted that by using the joint patterns described above, a joint pattern set, which is achieved by combining a pair of joint patterns over a distance from each other that is set to allow separation/resolution in the field of view of an optical length measuring machine with the line portions of their first patterns extending outward achieving a symmetrical relationship with each other with at least one identical joint pattern pair, may be prepared. By transferring and forming this joint pattern set onto a wafer, the coma aberration component of the stepper lens can be evaluated with a high degree of sensitivity through measurement of distances between the front ends along the lengthwise direction in the first patterns at the two sides of each joint pattern pair.

In a second aspect of the present invention, a pattern for stepper lens aberration characteristics evaluation, comprising a pattern set achieved by placing a third pattern having external dimensions that allow separation/resolution in the field of view of an optical length measuring machine and having a side parallel to the inner side of each second pattern in the joint pattern set described above in an inner space enclosed by the second patterns in the joint pattern set over distances from the second patterns that allow separation/resolution by the optical length measuring machine with sides of the third pattern extending parallel to the inner sides of the individual second patterns, is provided. By transferring and forming this pattern set onto a wafer, the degree to which the edges of the rectangular patterns undergoing measurement are affected by an aberration can be reduced. The shape of the third pattern may be rectangular, hexagonal or octagonal in correspondence to the number of joint pattern sets provided around it.

In a third aspect of the present invention, a pattern to be used for stepper lens aberration characteristics evaluation achieved by rotating the joint pattern set and the pattern set described above by the same degree is provided. For instance, by setting them rotated by 45 degrees, it becomes possible to evaluate the coma aberration component along the 0 degree direction, the +45 degrees direction, the −45 degrees direction and the 90 degrees direction. In addition, by setting the joint patterns in four directions, measurement and evaluation of the coma aberration component in two directions, i.e., the 0 degree direction and the 90 degrees direction, can be achieved with a single pattern. Furthermore, by positioning the joint patterns in eight directions, measurement and evaluation of the coma aberration components in four directions, i.e., the 0 degree direction, the +45 degrees direction, the −45 degrees direction and the 90 degrees direction can be achieved with a single pattern.

In a fourth aspect of the present invention, a pattern to be used for stepper lens aberration characteristics evaluation includes line-and-space type first patterns each constituted of a plurality of line patterns that each have a width along the direction of its shorter side set at a dimension that does not allow separation/resolution in the field of view of an optical length measuring machine, a second pattern having external dimensions that allow separation/resolution in the field of view of an optical length measuring machine and sides facing opposite each other extending parallel to each other, a roughly rectangular fourth pattern having external dimensions that allow separation/resolution in the field of view of an optical length measuring machine. A pattern set is achieved by joining the first patterns to at least two sides of the second pattern facing opposite each other and placing the fourth pattern over a distance that allows separation/resolution in the field of view of an optical length measuring machine from the front end of each first pattern along the direction of the length of the lines. By transferring and forming this pattern onto a wafer, the pattern dimensions can be measured by the optical length measuring machine and the astigmatism component of the stepper lens can be evaluation with a high degree of sensitivity through comparison/calculation.

In a fifth aspect of the present invention, a pattern to be used for stepper lens aberration characteristics evaluation comprising a pattern set achieved by joining line-and-space type fifth patterns each constituted of a plurality of line patterns each having a width along the direction of its shorter side set at a dimension that does not allow separation/resolution in the field of view of the optical length measuring machine with the outer sides of the fourth patterns is provided. By using this pattern set, various aberration components can be measured with a single pattern set.

In a sixth aspect of present invention, a pattern to be used for stepper lens aberration characteristics evaluation achieved by rotating the pattern set described above by the same degree is provided. By setting them rotated by 45 degrees each, the astigmatism components along the 0 degree −90 degrees direction and the 45 degrees direction can be evaluated.

It is to be noted that the line patterns described in reference to the first through sixth aspects may be formed in a rough wedge shape with their width at the bottom sides along the direction of their shorter sides set at a dimension that does not allow separation/resolution in the field of view of the optical length measuring machine. In addition, the width of the line patterns in the direction of their shorter sides mentioned in reference to the first through sixth aspects may be set equal to or smaller than the stepper resolution limit. Furthermore, the outermost dimensions of the joint pattern sets and the pattern sets described in reference to the first through sixth aspects may be set at dimensions that can be contained within the measurement field of view of the optical length measuring machine.

In a seventh aspect of the present invention, a stepper lens aberration characteristics evaluating method comprises a step in which an aberration characteristics evaluation pattern constituted of a pattern set achieved by setting at least two joint patterns, each formed by joining a line-and-space type first pattern constituted of a plurality of line patterns each having a width along the direction of its shorter side set at a dimension that does not allow separation/resolution in the field of view of an optical length measuring machine with a roughly rectangular second pattern having external dimensions that do not allow separation/resolution in the field of view of an optical length measuring machine in a rough comb shape over a distance from each other set at a dimension that allows separation/resolution in the field of view of an optical length measuring machine while achieving a positional relationship whereby line portions of the first patterns extending outward are symmetrical to each other is transferred onto an evaluation substrate by using a stepper. This method also includes a step in which an optical length measuring machine is utilized to measure the distance between the front end portion of the first pattern in the lengthwise direction and the edge of the second pattern on the opposite side from the first pattern in one of the joint patterns transferred onto the evaluation substrate. In another step, the distance between the front end portion of the first pattern along its lengthwise direction and the edge of the second pattern on the opposite side from the first pattern in another joint pattern positioned symmetrical to the one joint pattern is measured. Then a step is performed in which the dimensional values obtained through the measurement are compared to obtain their difference through calculation.

It is to be noted that the joint pattern set may include a third pattern having external dimensions that allow separation/resolution in the field of view of an optical length measuring machine and having a side extending parallel to the inner side of each of the second patterns, placed in an inner space enclosed by the second patterns in the joint pattern set over a distance that allows separation/resolution in the field of view of an optical length measuring machine from the second patterns.

In an eighth aspect of the present invention, a stepper lens aberration characteristics evaluating method comprises a step in which an aberration characteristic evaluation pattern constituted of a pattern set is achieved by joining line-and-space type first patterns each constituted of a plurality of line patterns each having a width along the direction of its shorter side set at a dimension that does not allow separation/resolution in the field of view of an optical length measuring machine with at least two sides facing opposite each other of a second pattern having external dimensions that allow separation/resolution in the field of view of the optical length measuring machine and sides facing opposite each other extending parallel to each other, and by placing fourth patterns each having external dimensions that allow separation/resolution in the field of view of the optical length measuring machine and formed in a roughly rectangular shape over a distance that allows separation/resolution in the field of view of the optical length measuring machine from the front ends of first patterns along the direction of the length of the line patterns is transferred onto an evaluation substrate by utilizing a stepper. In a subsequent step, an optical length measuring machine is utilized to measure the distance between the front ends of the first patterns along the lengthwise direction set on the two sides of the pattern set transferred onto the evaluation substrate.

It is to be noted that in the method described above, line-and-space type fifth patterns each constituted of a plurality of line patterns each having a width along the direction of its shorter side set at a dimension that does not allow separation/resolution in the field of view of an optical length measuring machine may be joined at the outer sides of the fourth patterns in the pattern set. Then, a step in which the distances between the front ends of the fifth patterns in the lengthwise direction and the edges of the fourth patterns on the opposite sides from the fifth patterns are measured and evaluated may be performed.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
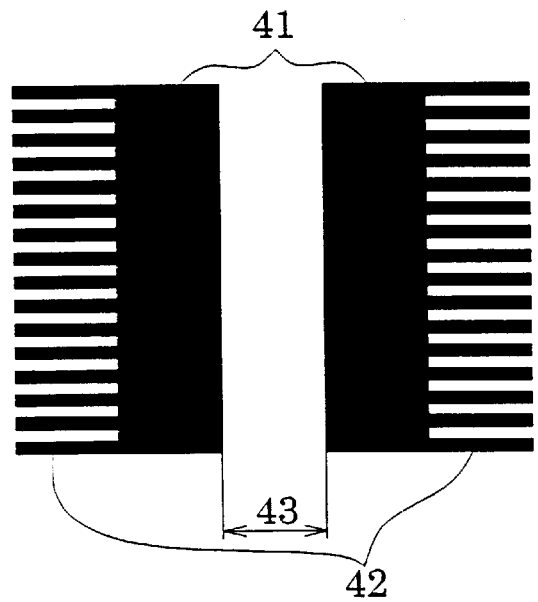
FIG. 1 illustrates the pattern configuration achieved in a first embodiment of the present invention.

The following is a detailed explanation of the preferred embodiments of the present invention given in reference to the drawings. FIG. 1(a) illustrates the pattern configuration achieved in the first embodiment of the present invention. The width of rectangular patterns 41 is several micrometers, whereas their length in the direction of the longer side is several micrometers~several tens of micrometers. The width and the length along the direction of the longer side are both set at dimensions that can be measured by an optical length measuring machine. Each rectangular pattern 41 is joined with a line-and-space pattern 42 along a longer side thereof. The width of the lines and spaces in the line-and-space patterns 42 is set at a dimension which will not be separated/resolved when the pattern is transferred and formed on a wafer using a stepper or a dimension that may allow separation/resolution but does not allow the individual pattern edges to appear separated/resolved during dimensional measurement performed with the optical length measuring machine. The length of the lines and spaces along their longer sides are set at several micrometers to ensure that even if the pattern shape changes due to a change in the exposure condition, line-and-space portions are present in the transferred and formed pattern.

Joint patterns are formed by joining such rectangular patterns 41 and line-and-space patterns 42. Then, these joint patterns are combined and positioned symmetrically to each other so that the line-and-space patterns 42 are set on the outside, as illustrated in FIG. 1(a). During this process, the distance 43 between the two rectangular patterns 41 on the inside is set at a dimension large enough to be separated/resolved by the stepper and the optical length measuring machine (several micrometers~several tens of micrometers).

Figure 1B:
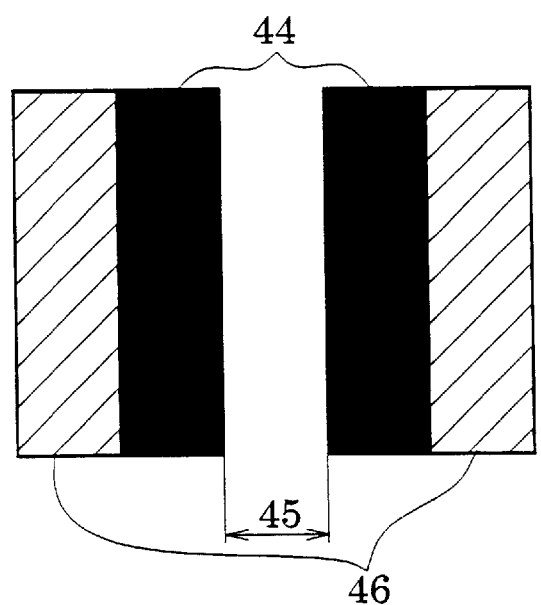

FIG. 1(b) is a pattern achieved by transferring and forming the pattern configuration shown in FIG. 1(a) with the stepper onto resist applied on a wafer. The rectangular patterns 44 and the distance 45 in FIG. 1(b) respectively correspond to the rectangular patterns 41 and the distance 43 between them in FIG. 1(a). The line-and-space patterns 42 in FIG. 1(a) are transferred and formed with their individual edge portions not separated/resolved, as indicated by the shaded areas in FIG. 1(b). As disclosed in Japanese Application No. 1995-511588, a line-and-space pattern formed at dimensions equal to or smaller than the stepper resolution limit is not separated/resolved and an overall film thickness reduction occurs due to the exposing light from the space pattern portions.

Figure 1C:
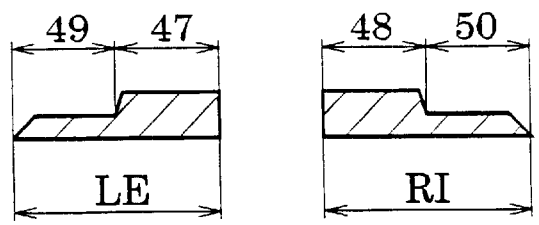

FIG. 1(c) is a sectional view of FIG. 1(b), illustrating the instance of this film thickness reduction. The dimensions 47 and 48 in FIG. 1(c) indicate the widths of the rectangular patterns 44, whereas the dimensions 49 and 50 indicate the widths of the shaded areas 46. As shown in the figure, the pattern is formed by sustaining a film thickness almost equal to the initial film thickness for the rectangular pattern portions. However, the film thickness corresponding to the line-and-space portions is reduced, i.e., the film thickness reduction has occurred.

In addition, the shapes of the front ends of the line-and-space portions readily change, reflecting any change in the exposure condition or any aberration sensitively. The length of the lines and spaces along the direction of their longer sides is known to change more sensitively than the widthwise dimension under normal circumstances in response to changes in the exposure condition or aberrations. Since the width of the lines and spaces is set at a dimension that does not allow separation/resolution by the stepper or at a dimension that may allow separation/resolution but does not allow the pattern to appear separated/resolved on the optical length measuring machine, the outer edges of the line-and-space portions in the measurement field of view of the optical length measuring machine achieve a linear pattern shape. Thus, it is possible to measure various dimensions using the optical length measuring machine. The pattern dimensions LE and RI in FIG. 1(c) are measured with the optical length measuring machine to ascertain a coma aberration as:

coma aberration=$(LE)-(RI)$ or;

coma aberration=$((LE)-(RI))/((LE)+(RI))$

As explained above, in this embodiment, by using line-and-space patterns having a width set at a dimension which does not allow separation/resolution by the stepper or a dimension which may allow separation/resolution but does not allow the pattern to appear separated/resolved of the optical length measuring machine, a coma aberration can be measured with the optical length measuring machine. Under normal circumstances, the front ends of the line-and-space patterns undergo changes in their shapes and dimensions more sensitively compared to the widthwise dimension, in response to changes in the stepper exposure condition and in response to aberrations. Thus, by adopting this method, measurement can be performed with a high degree of sensitively. By setting this pattern over the entire lens exposure range, coma aberration evaluation for the entire lens exposure range is enabled.

Figure 2A:
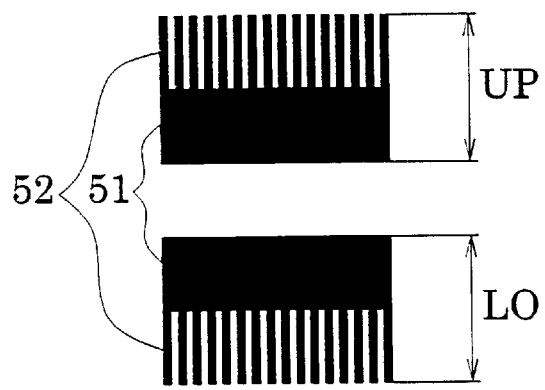
FIG. 2 illustrates the pattern configuration achieved in a second embodiment of the present invention.
Figure 2B:
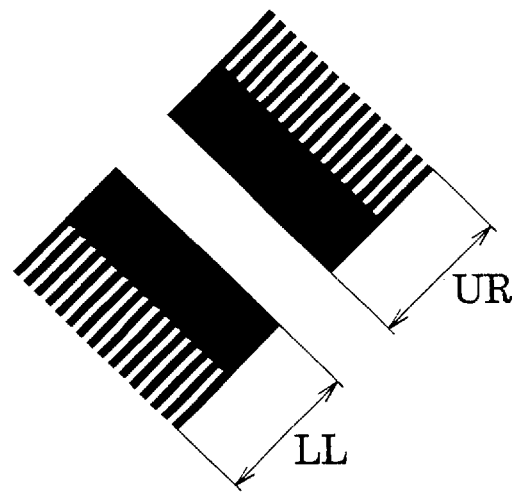

FIG. 2 illustrates the pattern configuration achieved in the second embodiment of the present invention. In FIGS. 2(a), (b) and (c) respectively, the pattern configuration in FIG. 1(a) is rotated by 90 degrees, 45 degrees in the counterclockwise direction and 45 degrees in the clockwise direction with the various dimensions remaining unchanged.

Figure 2C:
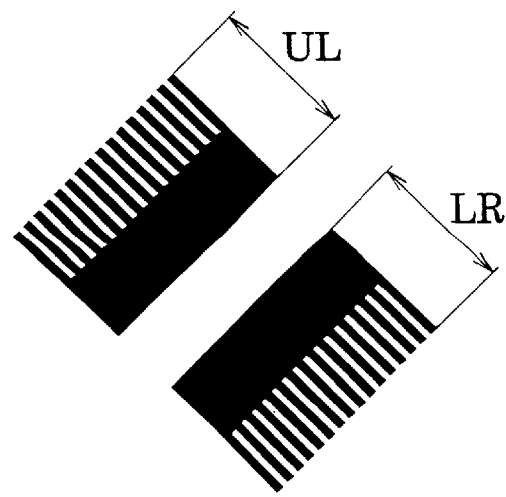

When these patterns are transferred and formed onto a wafer by using a stepper, the shapes of the resulting individual patterns are similar to those achieved in the first embodiment. Namely, in a pattern that has been formed, the film thickness is reduced over the line-and-space portions, their front ends have readily undergone changes in their dimensions and shapes by sensitively reflecting changes in the exposure condition of the stepper or any aberration and the outer edges of the pattern in the measurement field of view of the optical length measuring machine achieve a linear pattern shape. In this case, too, various dimensions can be measured with the optical length measuring machine. In the patterns that have been formed, lengths corresponding to UP and LO in FIG. 2(a), UR and LL in FIG. 2(b) and UL and LR in FIG. 2(c) are measured with the optical length measuring machine and coma aberrations are calculated through:

90 degrees direction coma aberration=(UP)-(LO)

+45 degrees direction coma aberration=(UR)-(LL)

-45 degrees direction coma aberration=(UL)-(LR)

Figure 3:
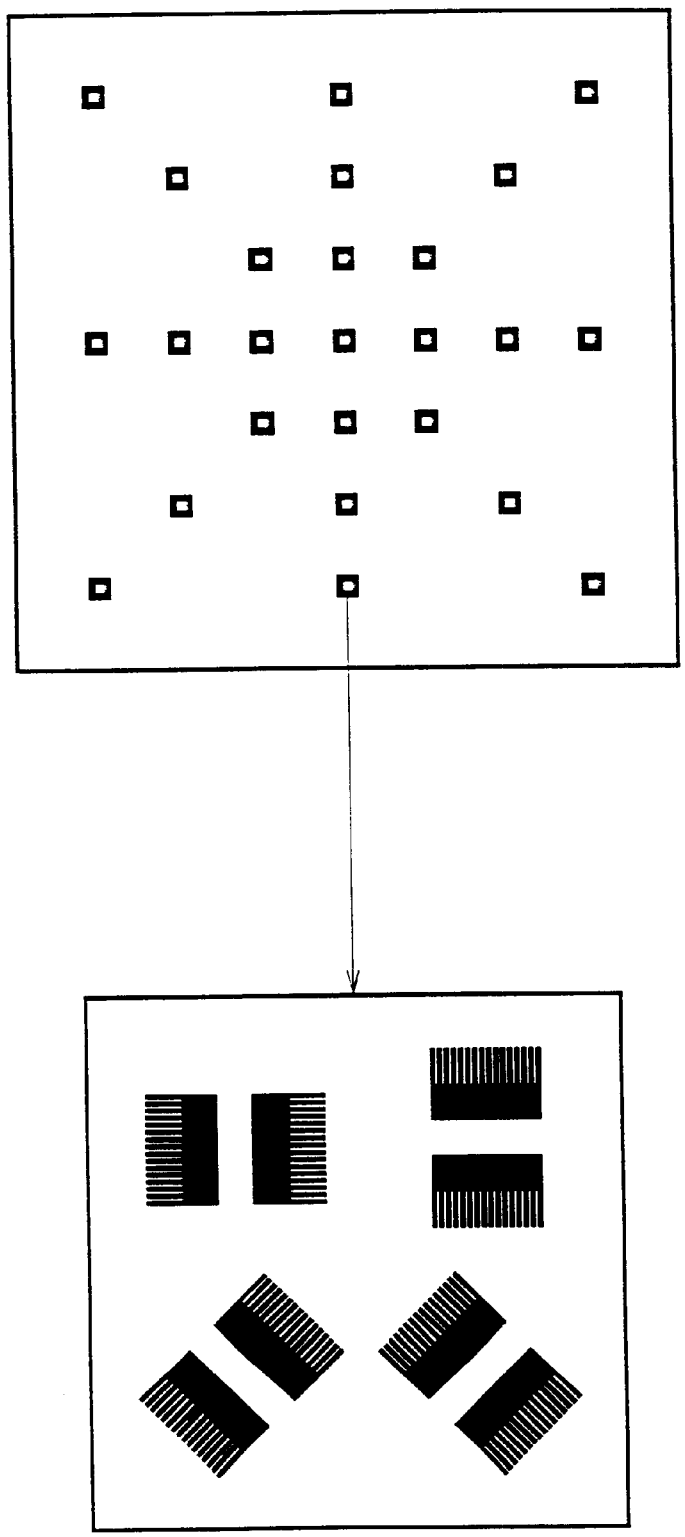
FIG. 3 illustrates the positions at which the pattern configuration is set within the lens exposure range.

Thus, in this embodiment, too, coma aberrations can be measured with a high degree of sensitivity using the optical length measuring machine as in the first embodiment. By rotating the pattern configuration by specific angles, the coma aberration components along the 90 degrees direction (vertical direction) and along the plus-minus 45 degrees directions can be measured. In addition, as illustrated in FIG. 3, the four types of pattern configurations including the pattern configuration in the first embodiment are evenly distributed over the entire lens exposure range. By using these pattern configurations to measure various dimensions and calculate coma aberration components, coma aberration components in the four directions can be evaluated over the entire stepper lens exposure range.

Figure 4A:
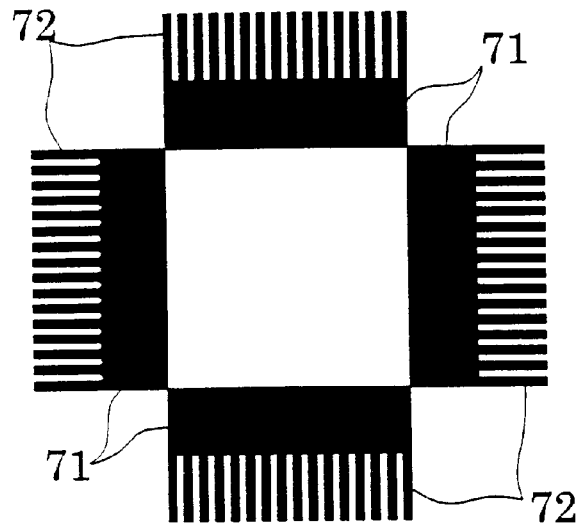
FIG. 4 illustrates the pattern configuration achieved in a third embodiment of the present invention.

FIG. 4(a) illustrates the pattern configuration in the third embodiment of the present invention. Rectangular patterns 71 and line-and-space patterns 72 have the same dimensions and structures as those of the rectangular pattern 41 and the line-and-space patterns 42 in the first embodiment respectively, and are joined in a similar manner. Such a joint pattern is set along four directions, i.e., up, down, left and right, with the line-and-space patterns 72 positioned on the outside. The dimensions of the various portions are set by ensuring that the outermost dimensions of the pattern configuration in FIG. 4(a) are contained within the measurement field of view of the optical length measuring machine utilized for measurement.

Figure 4B:
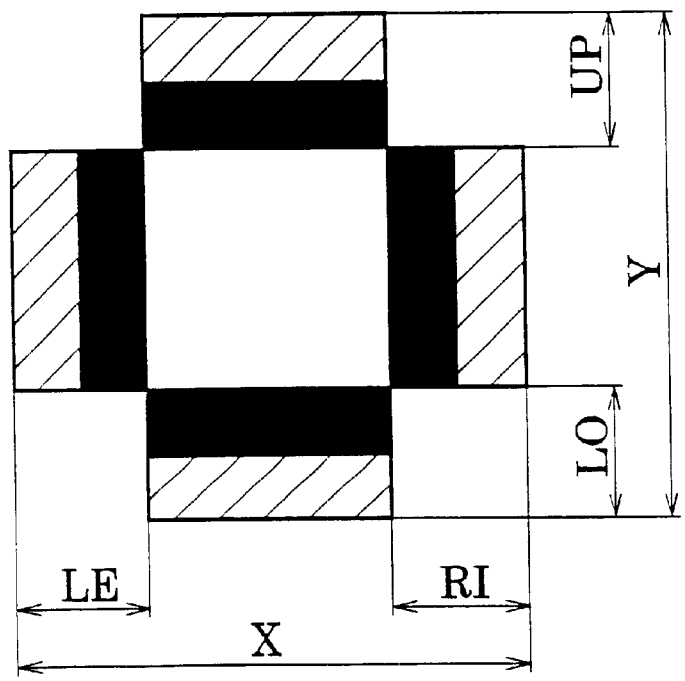

FIG. 4(b) shows a pattern obtained by transferring and forming the pattern configuration in FIG. 4(a) onto a wafer with a stepper. In the pattern thus formed, a film thickness reduction has occurred in the line-and-space portions, the front ends of the line-and-space portions have undergone changes in their dimensions and shapes by sensitively reflecting changes in the exposure condition and aberrations of the stepper and the pattern outer edges in the measurement field of view of the optical length measuring machine achieve a linear pattern shape, as in the first embodiment. In this case, too, various dimensions can be measured with the optical length measuring machine. The lengths of LE, RI, UP and LO in FIG. 4(b) are measured with an optical length measuring machine and coma aberrations are calculated through:

0 degree direction coma aberration=(LE)-(RI)

90 degrees direction coma aberration=(UP)-(LO)

In addition, X and Y in FIG. 4(b) are measured with the optical length measuring machine and an astigmatism along the 0°-90° direction is calculated through:

0 degree-90 degrees direction astigmatism=(X)-(Y)

Figure 19A:
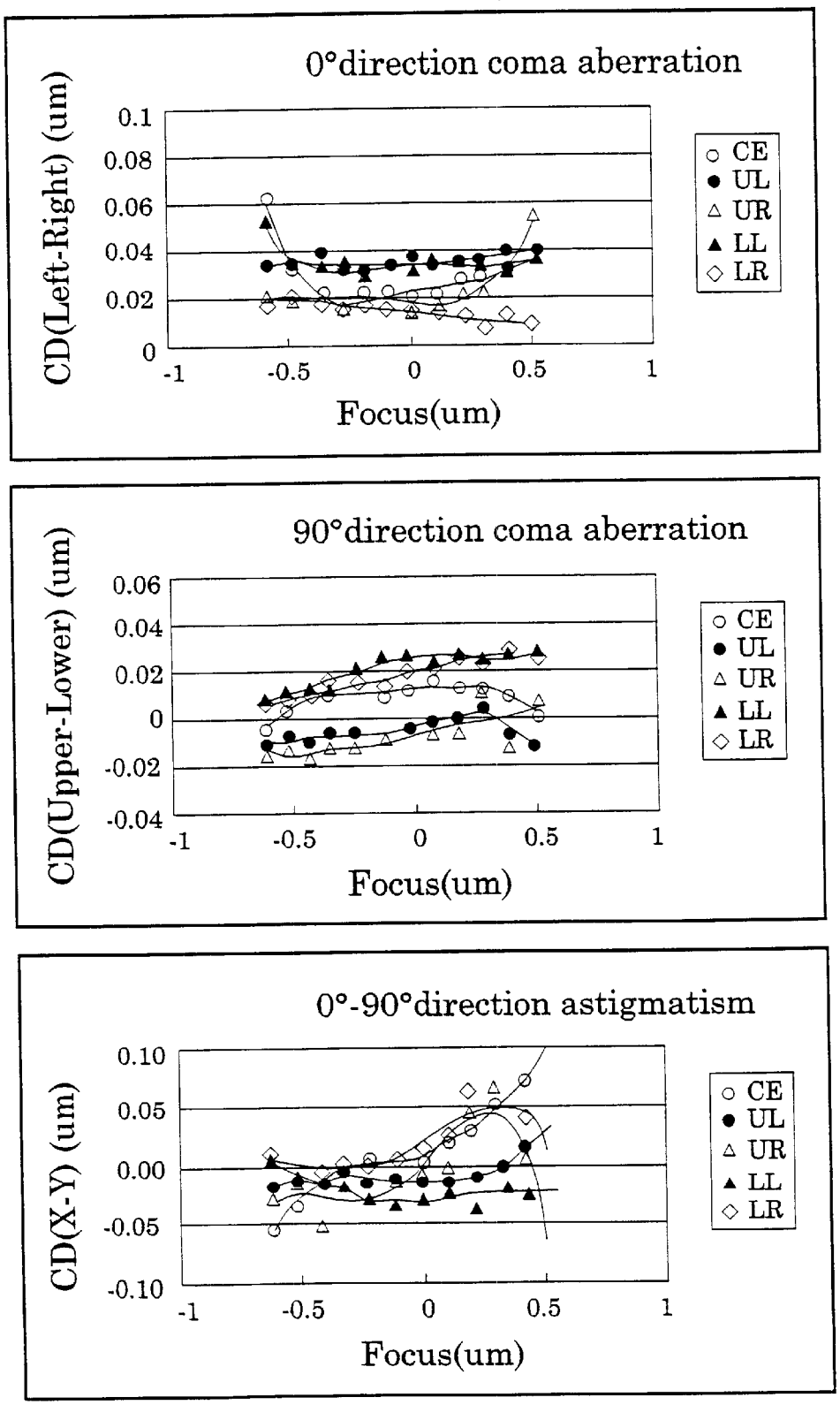
FIG. 19 illustrates the results of aberration measurement obtained by using the pattern configuration in the third embodiment of the present invention.
Figure 20A:
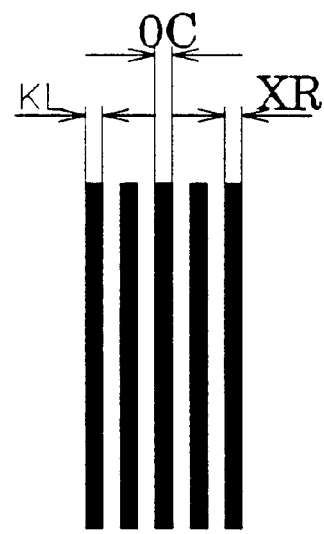
FIG. 20 illustrates a pattern configuration in the prior art.
Figure 20B:
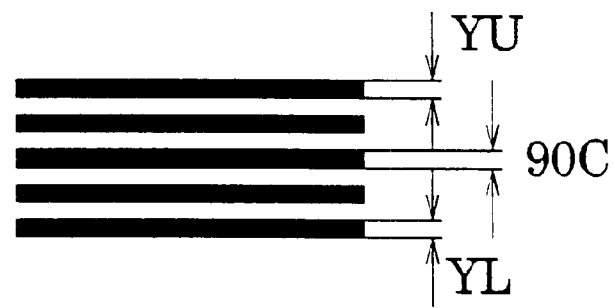
Figure 20C:
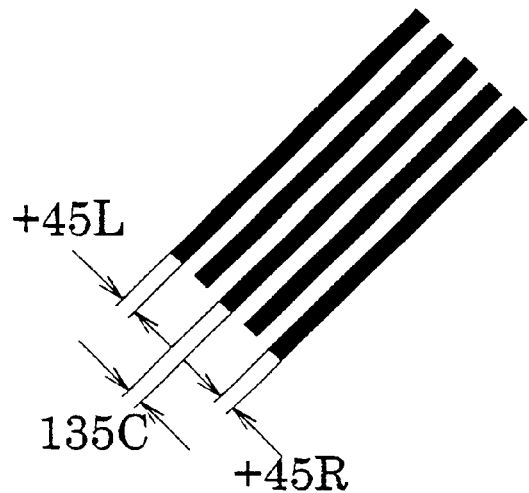
Figure 20D:
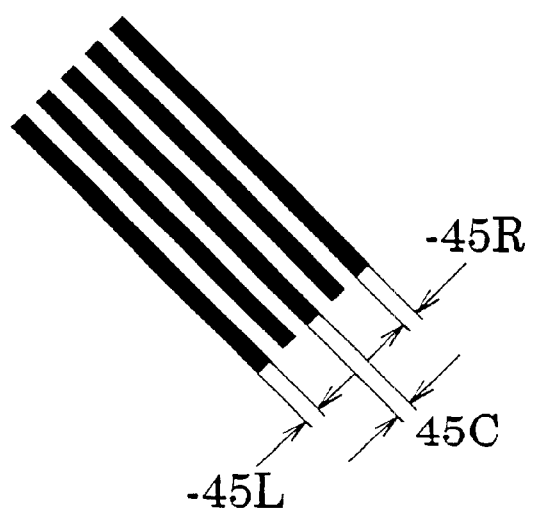
Figure 21:
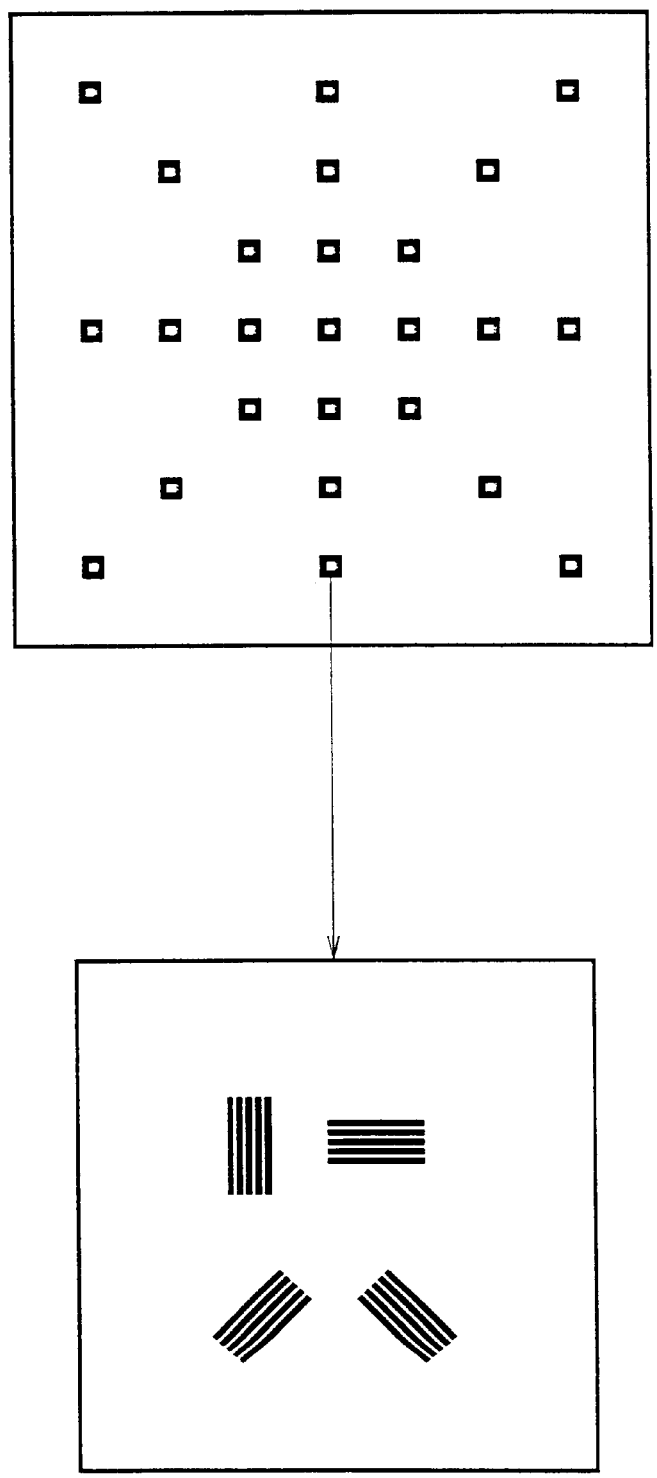
FIG. 21 shows positions of the pattern configuration within the lens exposure range in the prior art.
Figure 22:
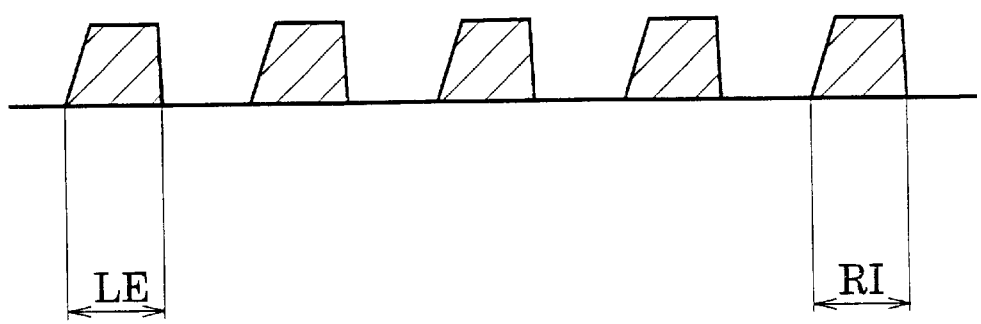
FIG. 22 presents sectional views of the transferred pattern in the prior art.
Figure 22:
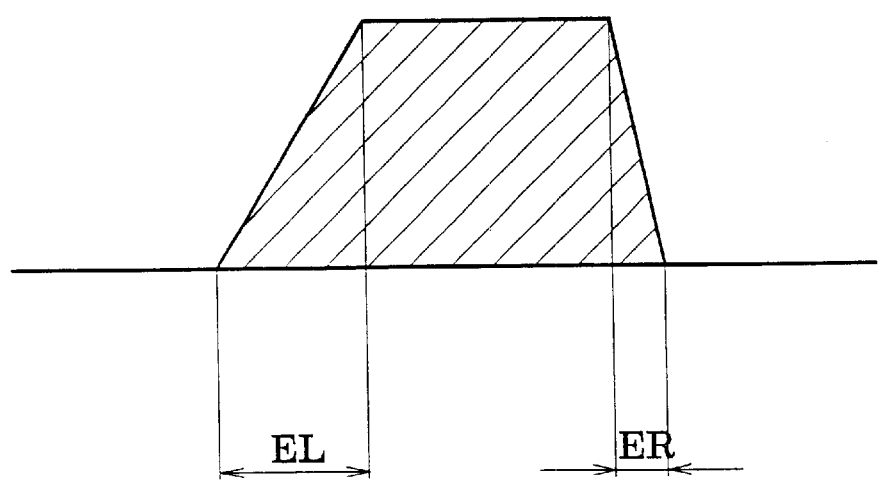

The graphs in FIG. 19(a) were prepared by plotting the coma aberration and the astigmatism manifested when the pattern configuration in FIG. 4(a) underwent pattern formation with the focus positions varied during exposure, which were ascertained through the method described above, with the horizontal axis representing the focus position. In each graph of aberrations, five different curves are presented in correspondence to different exposure shot positions. The individual exposure shot positions are illustrated in FIG. 19(b). If an ideal lens with no aberrations were used, all the plot points would indicate a numerical value of 0 along the vertical axis. In reality, dimensional differences attributable to the presence of aberrations are measured, as indicated in FIG. 19(a). FIG. 19(b) presents the various aberrations manifested with the focus position set to 0 in correspondence to the individual exposure shot positions, based upon the same measurement results, to clearly indicate the aberration components corresponding to the individual exposure shot positions.

As a result, in this embodiment, too, the optical length measuring machine can be employed to measure coma aberrations and astigmatism with a high degree of sensitivity as in the first embodiment. By setting the pattern configuration in the embodiment over the entire lens exposure range, it becomes possible to evaluate the coma aberration component and the astigmatism component for the entire lens exposure range. In the embodiment, by placing the pattern in the four directions, the coma aberration component and the astigmatism component can be evaluated along two directions, i.e., the 0 degree direction and the 90 degrees direction. Furthermore, the outermost dimensions of the pattern configuration in the embodiment are set so that they are contained within the measurement field of view of the optical length measuring machine. Thus, the same pattern can be used for dimensional measurement to ascertain coma aberrations in the two directions, i.e., the 0 degree direction and the 90 degrees direction, and for dimensional measurement to ascertain astigmatism along the 0°-90° direction, to result in an improvement in the work efficiency.

Figure 5A:
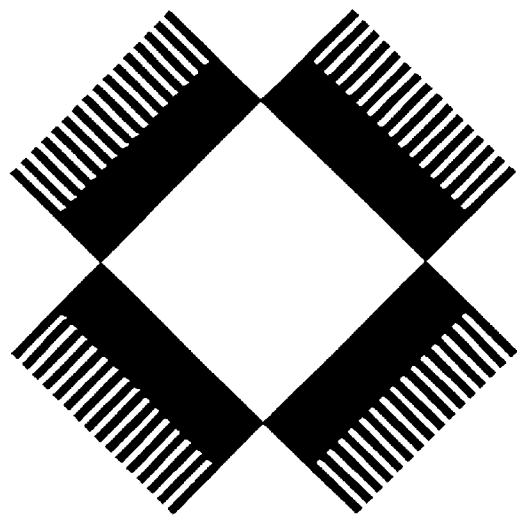
FIG. 5 illustrates the pattern configuration achieved in a fourth embodiment of the present invention.
Figure 5B:
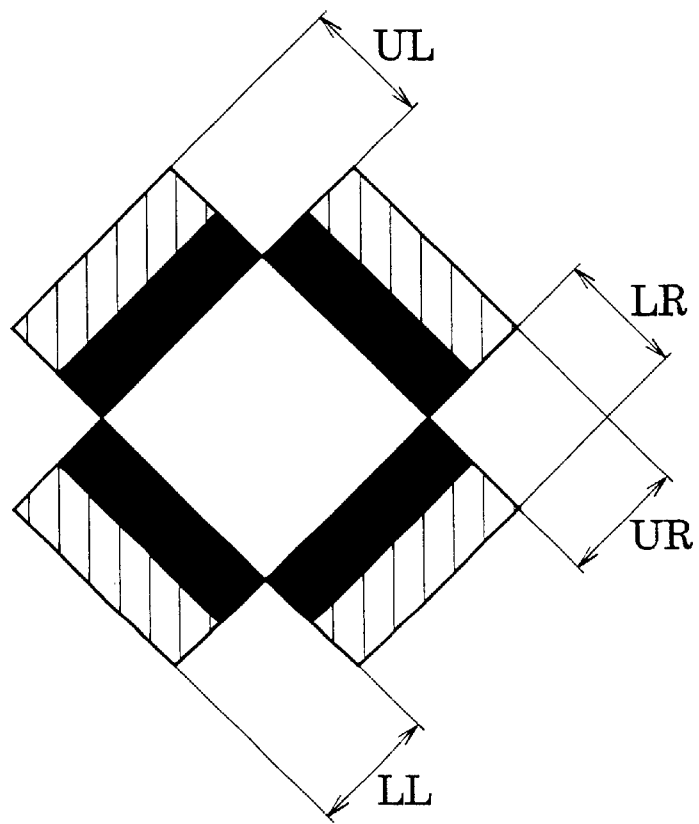

FIG. 5(a) illustrates the pattern configuration achieved in the fourth embodiment of the present invention. The pattern configuration in FIG. 5(a) is achieved by rotating the entire pattern configuration in FIG. 4(a) by 45 degrees. FIG. 5(b) shows a pattern obtained by transferring and forming the pattern configuration in FIG. 5(a) onto a wafer with a stepper. In the pattern thus formed, a film thickness reduction has occurred in the line-and-space portions, the front ends of the line-and-space portions have undergone changes in their dimensions and shapes by sensitively reflecting changes in the exposure condition and aberrations of the stepper and the pattern outer edges in the measurement field of view of the optical length measuring machine achieve a linear pattern shape, as in the first embodiment. In this case, too, various dimensions can be measured with the optical length measuring machine. The lengths of UR, LL, UL and LR in FIG. 5(b) are measured with an optical length measuring machine and coma aberrations are calculated through:

+45 degrees direction coma aberration=(UR)-(LL)

-45 degrees direction coma aberration=(UL)-(LR)

As a result, in this embodiment, too, the optical length measuring machine can be employed to measure coma aberrations with a high degree of sensitivity as in the first embodiment. By setting the pattern configuration in the embodiment over the entire lens exposure range, it becomes possible to evaluate the coma aberration component for the entire lens exposure range. In the embodiment, by placing the pattern in the four directions, the coma aberration component can be evaluated along two directions, i.e., the +45 degrees direction and the −45 degrees direction. Furthermore, the outermost dimensions of the pattern configuration in the embodiment are set so that they are contained within the measurement field of view of the optical length measuring machine. Thus, the same pattern can be used for dimensional measurement along the two directions, i.e., the +45 degrees direction and the −45 degrees direction, to achieve improvement in the work efficiency.

Figure 6:
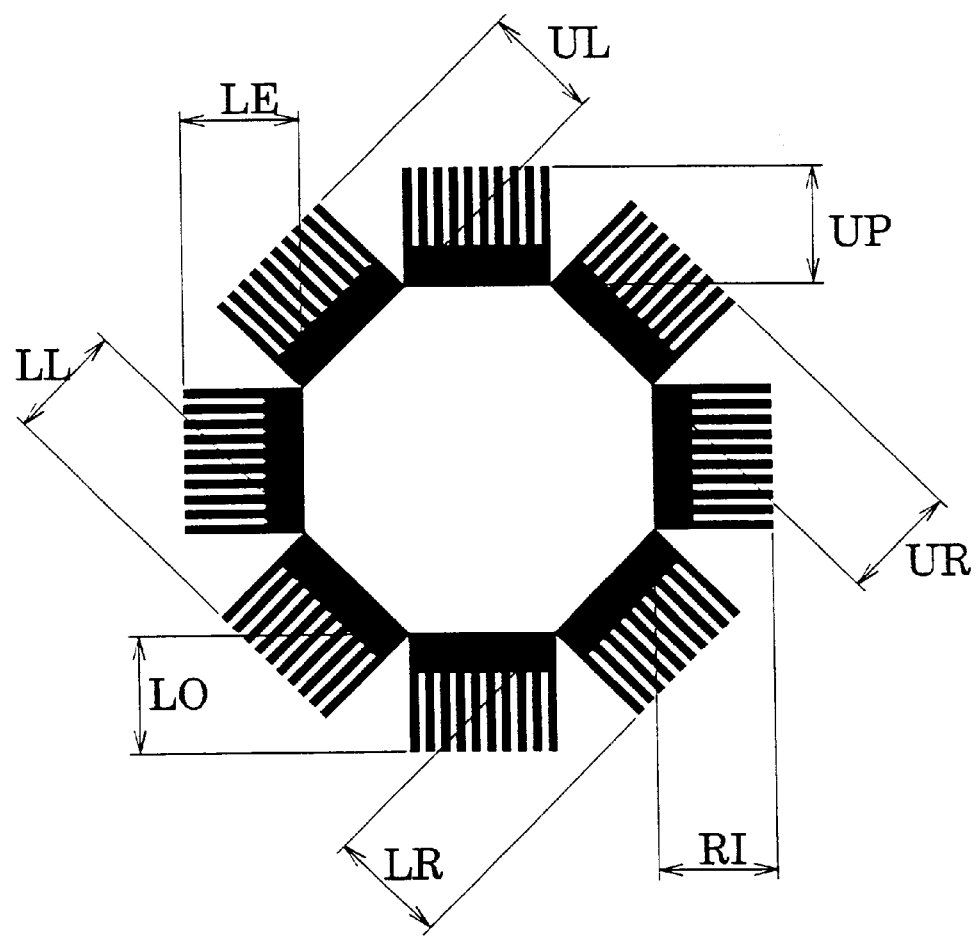
FIG. 6 illustrates the pattern configuration achieved in a fifth embodiment of the present invention.

FIG. 6 illustrates the pattern configuration achieved in the fifth embodiment of the present invention. The pattern configuration in FIG. 6 is achieved by placing the joint patterns described earlier each in one of the eight directions, i.e., up, down, left, right and the four 45 degrees directions, with the corners of the rectangular patterns set adjacent to each other and the line-and-space patterns positioned on the outside. The various dimensions of the rectangle patterns and the line-and-space patterns are the same as those in the preceding embodiments. The individual dimensions are set by ensuring that the outermost dimensions of the pattern configuration in the figure are contained within the measurement field of view of the optical length measuring machine to be used for measurement.

The pattern formed by transferring this pattern configuration onto a wafer with a stepper is similar to that achieved in the first embodiment. Namely, in the pattern thus formed, a film thickness reduction has occurred in the line-and-space portions, the front ends of the line-and-space portions have undergone changes in their dimensions and shapes by sensitively reflecting changes in the exposure condition and aberrations of the stepper and the pattern outer edges in the measurement field of view of the optical length measuring machine achieve a linear pattern shape. In this case, too, various dimensions can be measured with the optical length measuring machine. The lengths of UP, UR, RI, LR, LO, LL, LE and UL in FIG. 6 are measured with an optical length measuring machine and coma aberrations are calculated through:

0 degree direction coma aberration=$(LE)-(RI)$ 90 degrees direction coma aberration=$(UP)-(LO)$ +45 degrees direction coma aberration=$(UR)-(LL)$ −45 degrees direction coma aberration=$(UL)-(LR)$ As a result, in this embodiment, too, the optical length measuring machine can be employed to measure coma aberrations with a high degree of sensitivity as in the first embodiment. By setting the pattern configuration in the embodiment over the entire lens exposure range, it becomes possible to evaluate the coma aberration component for the entire lens exposure range. In the embodiment, by placing the pattern in the eight directions, the coma aberration component can be evaluated along four directions, i.e., the 0 degree direction, the 90 degrees direction the +45 degrees direction and the −45 degrees direction. Furthermore, the outermost dimensions of the pattern configuration in the embodiment are set so that they are contained within the measurement field of view of the optical length measuring machine. Thus, the same pattern can be used for dimensional measurement along the four directions, i.e., the 0 degrees direction, the 90 degrees direction, the +45 degrees direction and the −45 degrees direction, to achieve an improvement in the work efficiency.

Figure 7A:
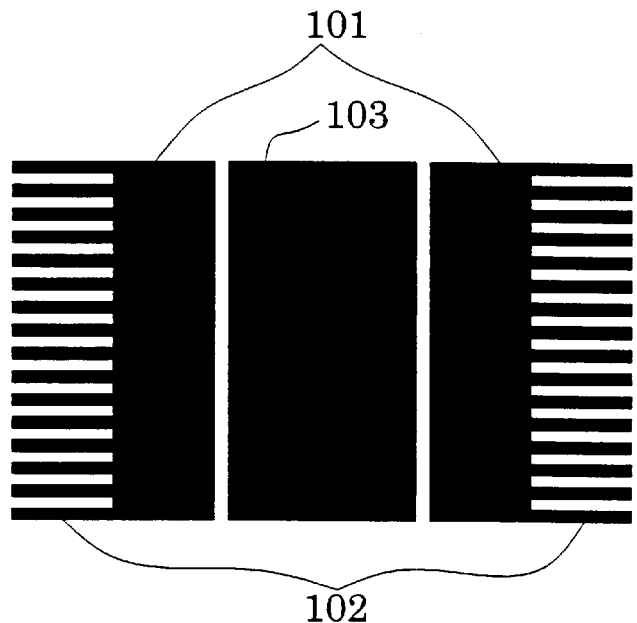
FIG. 7 illustrates the pattern configuration achieved in a sixth embodiment of the present invention.

FIG. 7(a) illustrates the pattern configuration achieved in the sixth embodiment of the present invention. The pattern configuration in FIG. 7(a) is achieved by adding a rectangular pattern to the pattern configuration illustrated in FIG. 1(a). An additional rectangular pattern 103 is placed between rectangular patterns 101 that are joined with line-and-space patterns 102. The width of the rectangular pattern 103 is within a range of several micrometers~several tens of micrometers, and its length along the direction of the longer side is roughly equal to that of the rectangular patterns 101. The distance between the rectangular pattern 103 and the rectangular patterns 101 is set at the minimum dimension that can be fully separated/resolved by the stepper to allow the pattern to be defined on the optical length measuring machine.

Figure 7B:
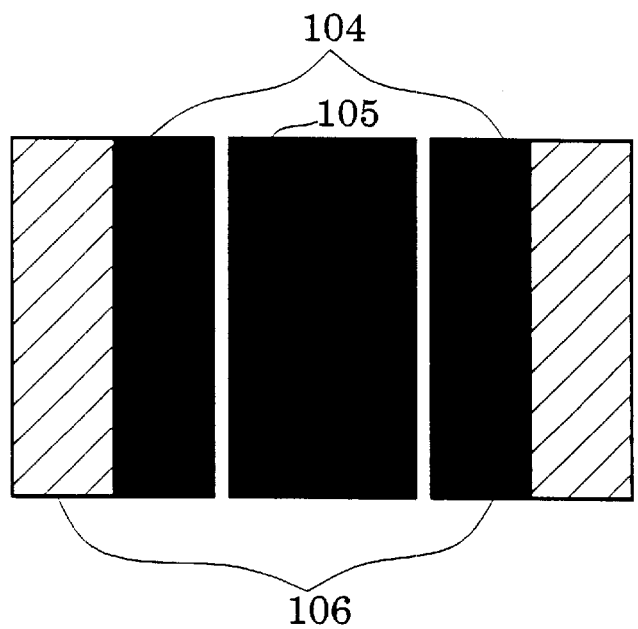

FIG. 7(b) illustrates the pattern formed by transferring the pattern configuration in FIG. 7(a) onto a wafer with the stepper. Rectangular patterns 104 and a rectangular pattern 105 in FIG. 7(b) respectively correspond to the rectangular patterns 101 and the rectangular pattern 103 in FIG. 7(a). In the resulting pattern, the individual edges of the line-and-space patterns 102 in FIG. 7(a) are not separated/resolved as indicated as shaded areas 106 in FIG. 7(b). Gaps are formed between the rectangular patterns 104 and the rectangular pattern 105.

Figure 7C:
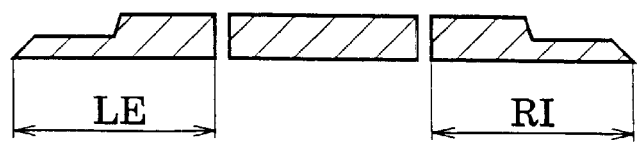

FIG. 7(c) is a sectional view of FIG. 7(b). As in the first embodiment, a reduction in the film thickness has occurred in the line-and-space portions, their front ends have sensitively undergone changes in dimension and shape in response to any changes in the exposure condition of the stepper or aberration, and the pattern outer edges in the measurement field of view of the optical length measuring machine achieve a linear pattern shape. In this case, too, the various dimensions can be measured with the optical length measuring machine. In the other areas, which are constituted of patterns completely shielded from light, the resist film thickness is equal to the initial film thickness. The edges between the rectangular patterns 104 and the rectangular pattern 105 achieve sharp definition, since these rectangular patterns are completely shielded from the light, as illustrated in the figure. In other words, the shape of the edges in these portions is less likely to be affected by the aberration component or the like during exposure. LE and RI in FIG. 7(c) are measured with the optical length measuring machine and the coma aberration is calculated through:

coma aberration=$(LE)-(RI)$

Thus, in this embodiment, too, the coma aberration can be measured with a high degree of sensitivity by employing the optical length measuring machine as in the first embodiment. By setting the pattern configuration in the embodiment over the entire lens exposure range, the coma aberration component over the entire lens exposure range can be evaluated. In addition, in this embodiment, in which another rectangular pattern is provided between the rectangular patterns undergoing the measurement, the shapes of the edges of the rectangular patterns undergoing the measurement are less likely to be affected by aberrations or the like to achieve highly accurate aberration measurement.

Figure 8A:
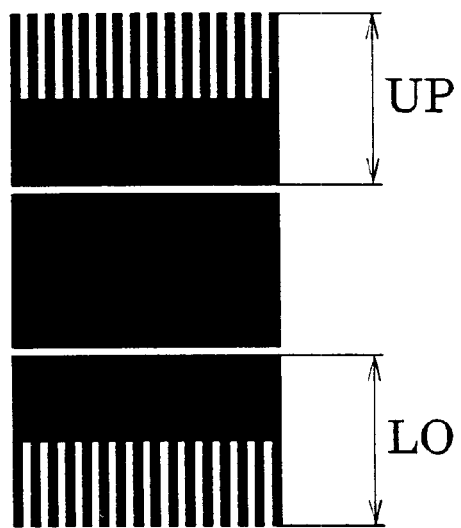
FIG. 8 illustrates the pattern configuration achieved in a seventh embodiment of the present invention.
Figure 8B:
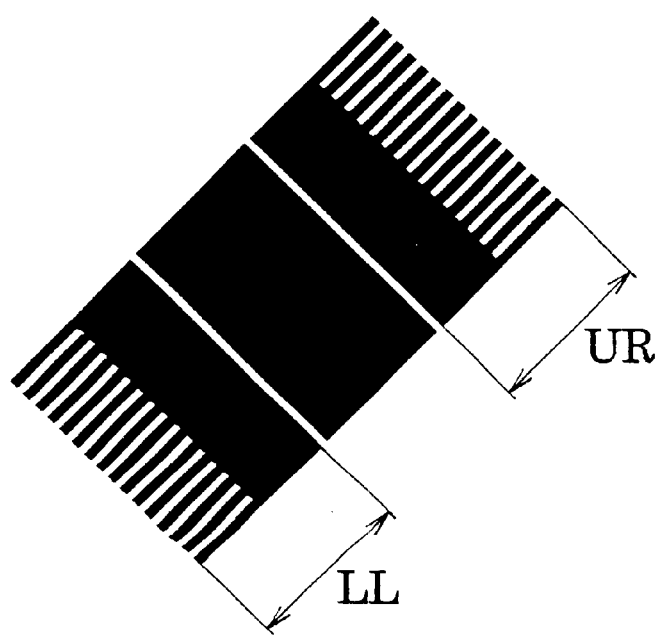

FIG. 8 illustrates the pattern configuration achieved in the seventh embodiment of the present invention. In FIGS. 8(a), (b) and (c), the pattern configuration in FIG. 7(a) is rotated by respectively, 90 degrees, 45 degrees in the counterclockwise direction and 45 degrees in the clockwise direction.

Figure 8C:
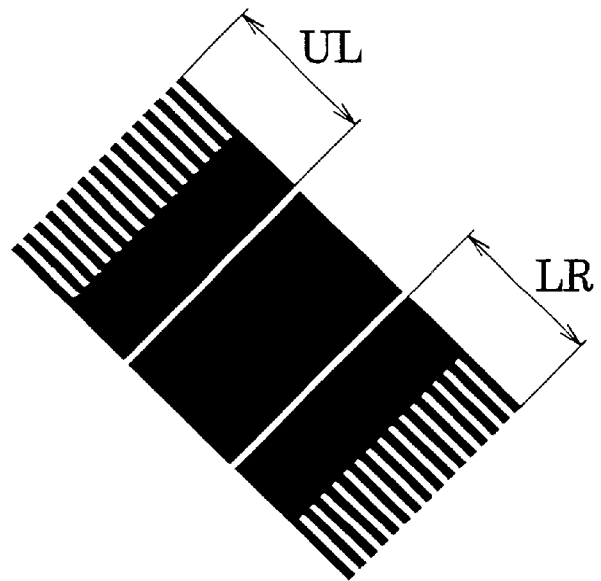

When these patterns are transferred and formed onto a wafer by using a stepper, the shapes of the resulting individual patterns are similar to those achieved in the sixth embodiment. Namely, in a pattern that has been formed, the film thickness is reduced over the line-and-space portions, their front ends have readily undergone changes in their dimensions and shapes by sensitively reflecting changes in the exposure condition of the stepper or any aberration, the outer edges of the pattern in the measurement field of view of the optical length measuring machine achieve a linear pattern shape and the shapes of the edges between the rectangular patterns are sharply defined, which is less likely to be affected by the aberration component and the like during exposure. In this case, too, various dimensions can be measured with the optical length measuring machine. In the patterns that have been formed, lengths corresponding to UP and LO in FIG. 8(a) UR and LL in FIG. 8(b) and UL and LR in FIG. 8(c) are measured and coma aberrations are calculated through:

90 degrees direction coma aberration=$(UP)-(LO)$

+45 degrees direction coma aberration=$(UR)-(LL)$

−45 degrees direction coma aberration=$(UL)-(LR)$

Thus, in this embodiment, too, coma aberrations can be measured with a high degree of sensitivity using the optical length measuring machine as in the first embodiment. By rotating the pattern configuration by specific angles, the coma aberration components along the 90 degrees direction (vertical direction) and along the plus-minus 45 degrees directions can be measured. In addition, a pattern configuration constituted of the four types of pattern configurations including the pattern configuration in the sixth embodiment illustrated in FIG. 7 may be placed over the entire lens exposure range. By using these pattern configurations to measure various dimensions and calculate coma aberration components, coma aberration components in the four directions can be evaluated over the entire stepper lens exposure range. Furthermore, by placing another rectangular pattern between the rectangular patterns undergoing dimensional measurement, the shapes of the edges of the rectangular patterns undergoing the measurement are made less likely to be affected by aberrations and the like to achieve highly accurate aberration measurement.

Figure 9:
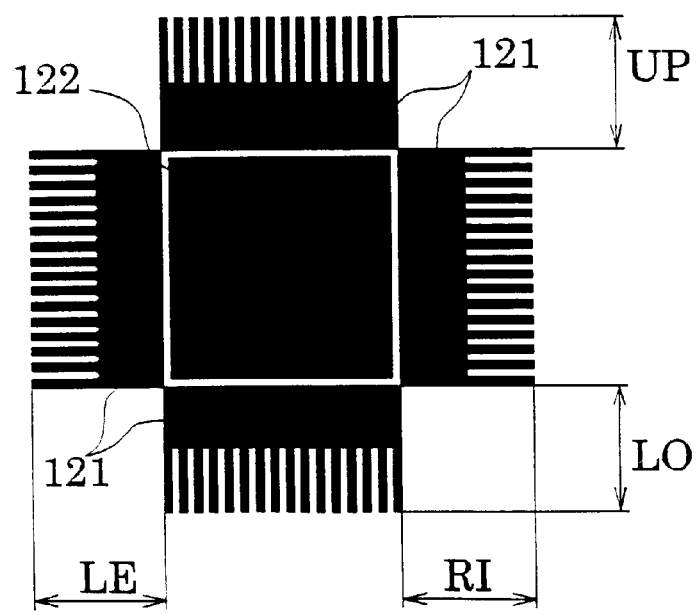
FIG. 9 illustrates the pattern configuration achieved in an eighth embodiment of the present invention.

FIG. 9 illustrates the pattern configuration in the eighth embodiment of the present invention, which is achieved by adding a rectangular pattern to the pattern configuration shown in FIG. 4(a). An additional rectangular pattern 122 is placed in the space enclosed by the rectangular patterns 121 joined to the line-and-space patterns. The distance between the rectangular patterns 121 and the rectangular pattern 122 is set at the minimum dimension that can be fully separated/resolved by the stepper to allow the pattern to be defined on the optical length measuring machine.

When this pattern is transferred and formed onto the wafer by using a stepper, the resulting pattern is similar to that achieved in the sixth embodiment. Namely, in the pattern that has been formed, the film thickness is reduced over the line-and-space portions, their front ends readily undergo changes in dimension and shape by sensitively reflecting changes in the exposure condition of the stepper or any aberration, the outer edges of the pattern in the measurement field of view of the optical length measuring machine achieve a linear pattern shape and the shapes of the edges between the rectangular patterns are sharply defined, which is less likely to be affected by the aberration component and the like during exposure. In this case, too, various dimensions can be measured with the optical length measuring machine. In the pattern that has been formed, lengths corresponding to LE, RI, UP and LO in FIG. 9 are measured with the optical length measuring machine and coma aberrations are calculated through:

0 degree direction coma aberration=$(LE)-(RI)$ 90 degrees direction coma aberration=$(UP)-(LO)$ Thus, in this embodiment, too, coma aberration can be measured with a high degree of sensitivity by using the optical length measuring machine as in the first embodiment. By placing the pattern configuration in the embodiment over the entire lens exposure range, the coma aberration component over the entire lens exposure range can be evaluated. In the embodiment in which the pattern is placed along the four directions, the coma aberration components in two directions, i.e., the 0 degree direction and the 90 degrees direction can be evaluated. Furthermore, by placing another rectangular pattern between the rectangular patterns undergoing dimensional measurement, the shapes of the edges of the rectangular patterns undergoing the measurement are made less likely to be affected by aberrations and the like to achieve highly accurate aberration measurement. By setting the outermost dimensions of this pattern configuration so that they can be contained within the measurement field of view of the optical length measuring machine during the design stage, the dimensional measurement in the two directions, i.e., the 0 degree direction and the 90 degrees direction can be achieved by using the same pattern to result in an improvement in work efficiency.

Figure 10:
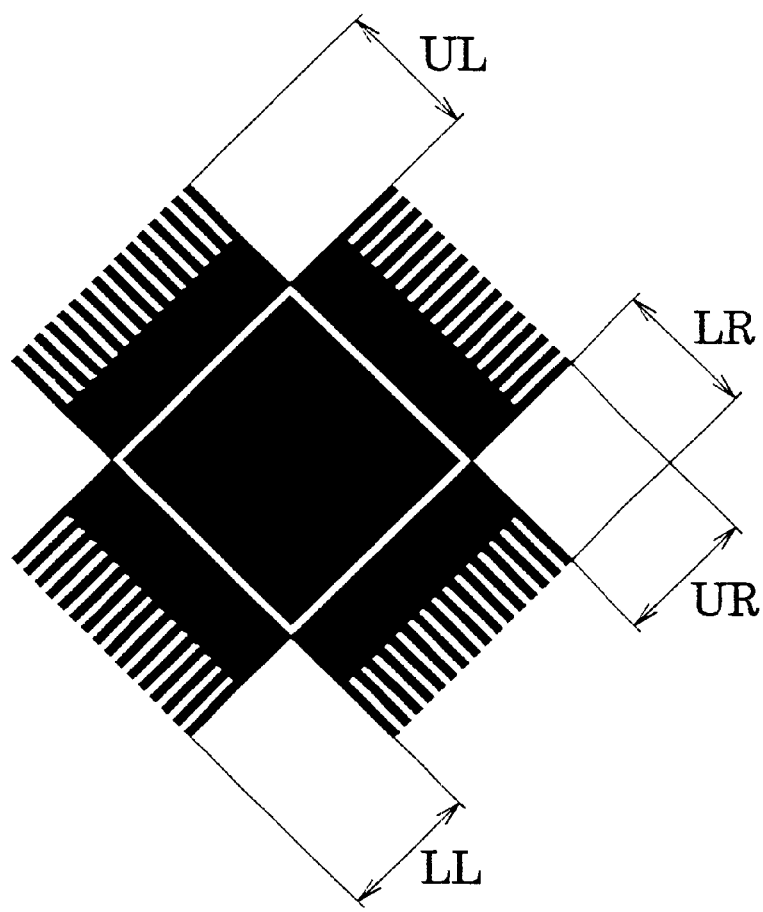
FIG. 10 illustrates the pattern configuration achieved in a ninth embodiment of the present invention.

FIG. 10 illustrates the pattern configuration in the ninth embodiment of the present invention, which is achieved by rotating the pattern configuration shown in FIG. 9 by 45 degrees. When this pattern is transferred and formed onto the wafer by using a stepper, the resulting pattern is similar to that achieved in the sixth embodiment. Namely, in the pattern that has been formed, the film thickness is reduced over the line-and-space portions, their front ends have readily undergone changes in their dimensions and shapes by sensitively reflecting changes in the exposure condition of the stepper or any aberration, the outer edges of the pattern in the measurement field of view of the optical length measuring machine achieve a linear pattern shape and the shapes of the edges between the rectangular patterns are sharply defined, which is less likely to be affected by the aberration component and the like during exposure. In this case, too, various dimensions can be measured with the optical length measuring machine. In the pattern that has been formed, lengths corresponding to UR, LR, LL and UL in FIG. 10 are measured with the optical length measuring machine and coma aberrations are calculated through:

+45 degrees direction coma aberration=$(UR)-(LL)$

−45 degrees direction coma aberration=$(UL)-(LR)$

Thus, in this embodiment, too, coma aberration can be measured with a high degree of sensitivity by using the optical length measuring machine as in the eighth embodiment. By placing the pattern configuration in the embodiment over the entire lens exposure range, the coma aberration component over the entire lens exposure range can be evaluated. In the embodiment in which the pattern is placed along the four directions, the coma aberration components in two directions, i.e., the +45 degrees direction and the −45 degrees direction can be evaluated. Furthermore, by placing another rectangular pattern between the rectangular patterns undergoing dimensional measurement, the shapes of the edges of the rectangular patterns undergoing the measurement are made less likely to be affected by aberrations and the like to achieve highly accurate aberration measurement. By setting the outermost dimensions of this pattern configuration so that they can be contained within the measurement field of view of the optical length measuring machine during the design stage, the dimensional measurement in the two directions, i.e., the +45 degrees direction and the −45 degrees direction can be achieved by using the same pattern to result in an improvement in work efficiency.

Figure 11:
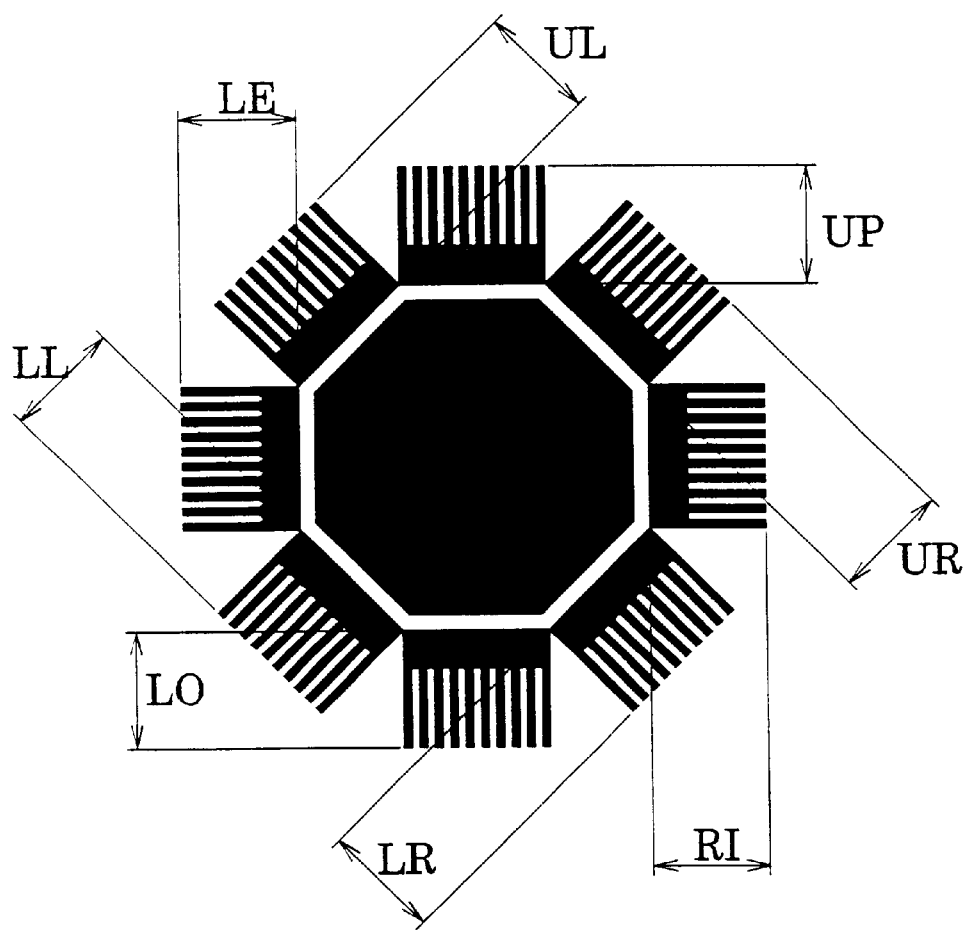
FIG. 11 illustrates the pattern configuration achieved in a tenth embodiment of the present invention.

FIG. 11 illustrates the pattern configuration in the tenth embodiment of the present invention, which is achieved by adding an octagonal pattern to the pattern configuration in FIG. 6. The additional octagonal pattern is placed in the inner space enclosed by the rectangular patterns set in the eight directions so that the edges of the octagonal pattern on the inside extend parallel to the rectangular patterns. The distance between the rectangular patterns on the outside and the octagonal pattern on the inside is set at the minimum dimension that can be still fully separated/resolved by the stepper to allow the pattern to be defined on the optical length measuring machine. In addition, the various dimensions are set so that the outermost dimensions of the pattern configuration in the figure can be contained within the measurement field of view of the optical length measuring machine used for measurement.

When this pattern is transferred and formed onto the wafer by using a stepper, the resulting pattern is similar to that achieved in the sixth embodiment. Namely, in the pattern that has been formed, the film thickness is reduced over the line-and-space portions, their front ends have readily undergone changes in their dimensions and shapes by sensitively reflecting changes in the exposure condition of the stepper or any aberration and the outer edges of the pattern in the measurement field of view of the optical length measuring machine achieve a linear pattern shape. The shapes of the edges between the rectangular patterns and the octagonal pattern on the inside are sharply defined, which is less likely to be affected by the aberration component and the like during exposure. In this case, too, various dimensions can be measured with the optical length measuring machine. In the pattern that has been formed, lengths corresponding to UP, UR, RI, LR, LO, LL, LE and UL in FIG. 11 are measured with the optical length measuring machine and coma aberrations are calculated through:

0 degree direction coma aberration=(LE)−(RI)

90 degrees direction coma aberration=(UP)−(LO)

+45 degrees direction coma aberration=(UR)−(LL)

−45 degrees direction coma aberration=(UL)−(LR)

Thus, in this embodiment, too, coma aberration can be measured with a high degree of sensitivity by using the optical length measuring machine as in the ninth embodiment. By placing the pattern configuration in the embodiment over the entire lens exposure range, the coma aberration component over the entire lens exposure range can be evaluated. In the embodiment in which the pattern is placed along the eight directions, the coma aberration components in four directions, i.e., the 0 degree direction, the 90 degrees direction, the −45 degrees direction and the +45 degrees direction can be evaluated with a single pattern structure. Furthermore, by placing an octagonal pattern in the inner space enclosed by the rectangular patterns undergoing dimensional measurement, the shapes of the edges of the rectangular patterns undergoing the measurement are made less likely to be affected by aberrations and the like to achieve highly accurate aberration measurement. Moreover, the dimensions of the pattern configuration in this embodiment are set so that they can be contained within the measurement field of view of the optical length measuring machine. Consequently, dimensional measurement in the four directions, i.e., the 0 degree direction, the 90 degrees direction, the −45 degrees direction and the +45 degrees direction can be performed at the same time using a single pattern to result in an improvement in work efficiency.

Figure 12A:
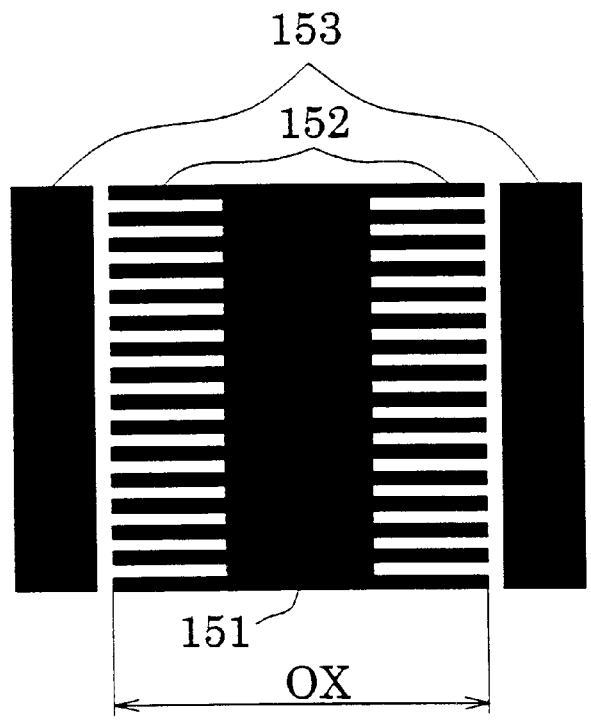
FIG. 12 illustrates the pattern configuration achieved in an eleventh embodiment of the present invention.

FIG. 12(a) illustrates the pattern configuration achieved in the eleventh embodiment of the present invention. The width of a rectangular pattern 151 is several micrometers, whereas its height is several micrometers~several tens of micrometers. The rectangular pattern 151 is joined with line-and-space patterns 152 along its two longer sides facing opposite each other. The width of the lines and spaces in the line-and-space patterns 152 is set at a dimension which will not be separated/resolved when the pattern is transferred and formed on a wafer using a stepper or a dimension that may allow separation/resolution but does not allow the individual pattern edges to appear separated/resolved during dimensional measurement performed with the optical length measuring machine. The length of the lines and spaces along their longer sides are set at several micrometers to ensure that even if the pattern shape changes due to a change in the exposure condition, line-and-space portions are present in the transferred and formed pattern. Rectangular patterns 153 are set over a distance from the outer sides of the line-and-space patterns 152. The distance between the line-and-space patterns 152 and the rectangular patterns 153 is set at the minimum dimension that can be fully separated/resolved by the stepper to allow the pattern to be defined on the optical length measuring machine. The width of the rectangular patterns 153 is at least several micrometers and their length along the direction of the longer side is roughly equal to that of the rectangular pattern 151. In the pattern configuration, the various dimensions are set so that the outermost dimensions of the line-and-space patterns 152, i.e., OX in the figure, are contained within the measurement field of view of the optical length measuring machine to be used for measurement.

Figure 12B:
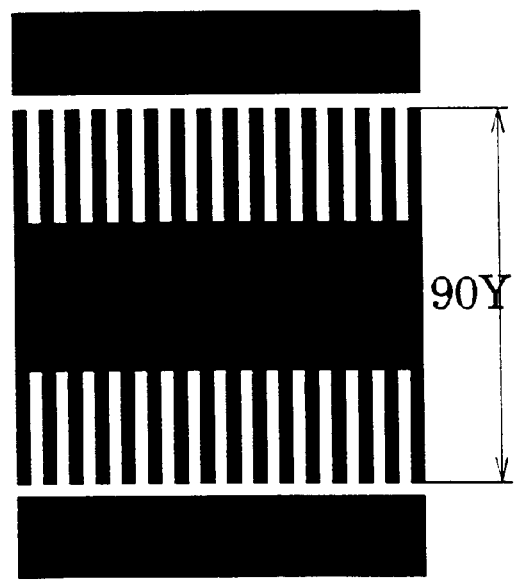

FIG. 12(b) shows a pattern configuration achieved by rotating the pattern configuration in FIG. 12(a) by 90 degrees, with the individual pattern dimensions and structures remaining unchanged from those in FIG. 12(a). 90Y in FIG. 12(b) corresponds to 0X in FIG. 12(a).

Figure 12C:
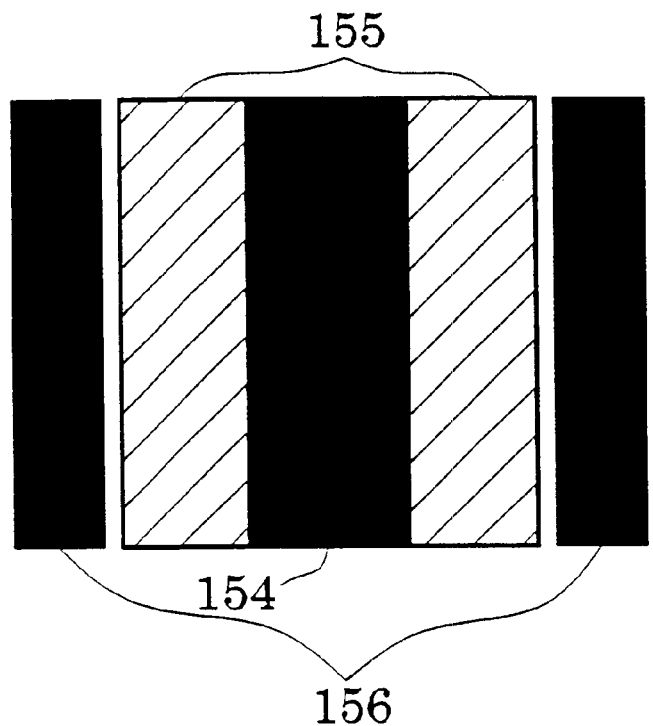
Figure 12D:
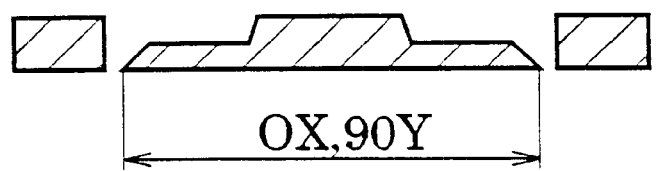

FIG. 12(c) is a pattern achieved by transferring and forming the pattern configuration shown in FIG. 12(a) with the stepper onto a wafer. The rectangular pattern 151, the line-and-space patterns 152 and the rectangular patterns 153 in FIG. 12(a) respectively correspond to a rectangular pattern 154, shaded areas 155 and rectangular patterns 156 in FIG. 12(c). FIG. 12(d) is a sectional view of the pattern formed by using the pattern configuration shown in FIG. 12(a) or 12(b).

An overall reduction in the film thickness occurs in the line-and-space portions which receive the exposing light from the space pattern portions. The length of the lines and spaces along the direction of their longer sides change more readily than the widthwise dimension under normal circumstances in response to changes in the exposure condition or aberrations. Since the width of the lines and spaces is set at a dimension that does not allow separation/resolution by the stepper or at a dimension that may allow separation/resolution but does not allow the pattern to appear separated/resolved on the optical length measuring machine, the outer edges of the line-and-space portions in the measurement field of view of the optical length measuring machine achieve a linear shape. In this case, too, it is possible to measure various dimensions using the optical length measuring machine.

In addition, since the rectangular patterns 156 are adjacent to the outer sides of the line-and-space patterns 155, the shapes of the front ends of the line-and-space patterns 155 are less readily affected by coma aberrations or the like. The reason for this is that when there is another pattern set adjacent to a pattern, the aberration component affecting the pattern shape is reduced compared to the aberration component affecting a pattern with no adjacent pattern present. Since the pattern configuration in FIG. 12(a) and the pattern configuration in FIG. 12(b) are set in different directions from each other, the dimensions corresponding to 0X in FIG. 12(a) and 90Y in FIG. 12(b) in the pattern that has been formed are measured with the optical length measuring machine and the dimensional difference is calculated as indicated below to evaluate it as an astigmatism.

0°–90° direction astigmatism=(0X)–(90Y)

As explained above, an astigmatism can be measured with the optical length measuring machine in this embodiment. In addition, since the dimension of a line-and-space pattern along the longer side more readily undergoes changes in response to changes in the exposure condition and aberrations of the stepper compared to the dimension along the width under normal circumstances, an evaluation method achieving a high degree of sensitivity is realized. Furthermore, in the embodiment in which rectangular patterns are placed on the outside of the line-and-space patterns undergoing the measurement, an astigmatism can be measured in a state in which the shapes of the front ends of the line-and-space patterns undergoing the measurement are less readily affected by coma aberrations or the like. By placing this pattern over the entire lens exposure range, the astigmatism can be evaluated for the entire lens exposure range. It is to be noted that while the line-and-space patterns 152 are joined with the rectangular pattern 151 in this embodiment, similar advantages are achieved even when the rectangular pattern 151 is eliminated.

Figure 13A:
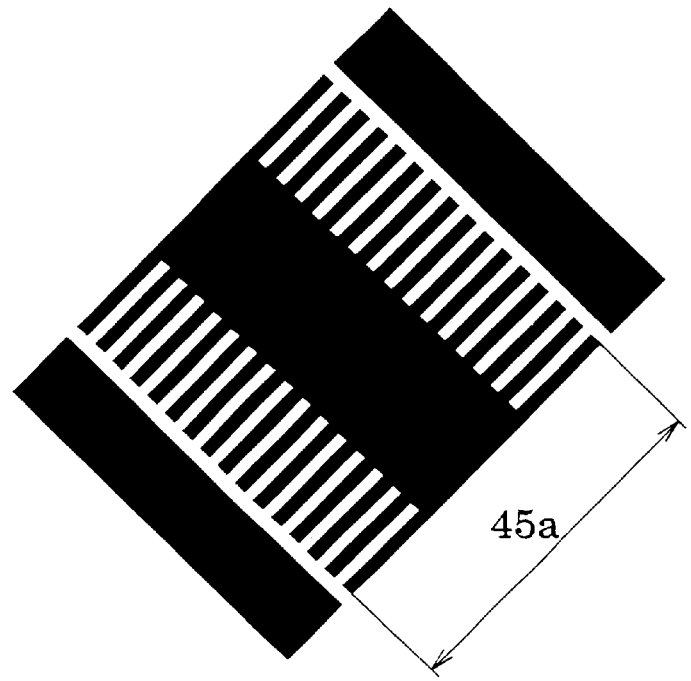
FIG. 13 illustrates the pattern configuration achieved in a twelfth embodiment of the present invention.

FIG. 13 illustrates the pattern configurations achieved in the twelfth embodiment of the present invention. The pattern configurations in FIGS. 13(a) and (b) are respectively achieved by rotating the pattern configuration in FIG. 12(a) by 45 degrees in the counterclockwise direction and by 45 degrees in the clockwise direction.

Figure 13B:
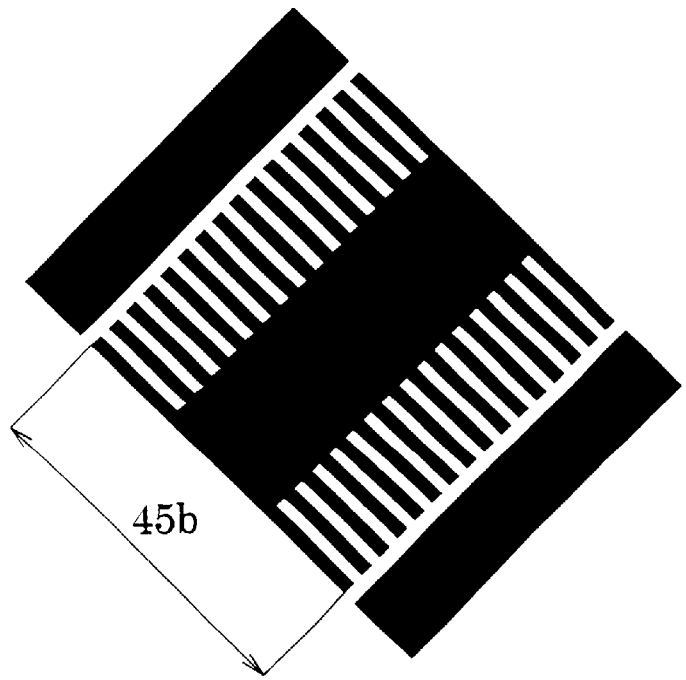

The pattern formed by transferring these patterns onto a wafer with a stepper is similar to that achieved in the eleventh embodiment. Namely, in the resulting pattern, a reduction in the film thickness has occurred in the line-and-space portions, the dimensions along the direction of the longer side of the line-and-space patterns have undergone changes sensitively in response to changes in the exposure condition of the stepper or aberrations and the pattern outer edges in the measurement field of view of the optical length measuring machine achieve a linear pattern shape, thereby enabling measurement of various dimensions by using the optical length measuring machine. In addition, the shapes of the front ends of the line-and-space patterns are less readily affected by coma aberrations or the like. The dimensions of the pattern that has been formed corresponding to 45a in FIGS. 13(a) and 45b in FIG. 13(b) are measured with the optical length measuring machine to calculate an astigmatism as follows:

45 degrees direction astigmatism=(45a)–(45b)

Thus, in this embodiment, too, the 45 degrees direction astigmatism can be measured with a high degree of sensitivity with the optical length measuring machine without being greatly affected by coma aberrations or the like, as in the eleventh embodiment. By distributing this pattern over the entire lens exposure range, the astigmatism can be evaluated for the entire lens exposure range. In addition, by combining this embodiment with the eleventh embodiment and distributing the four different types of patterns over the lens exposure range, astigmatism in two directions manifesting under a single exposure condition can be evaluated.

Figure 14:
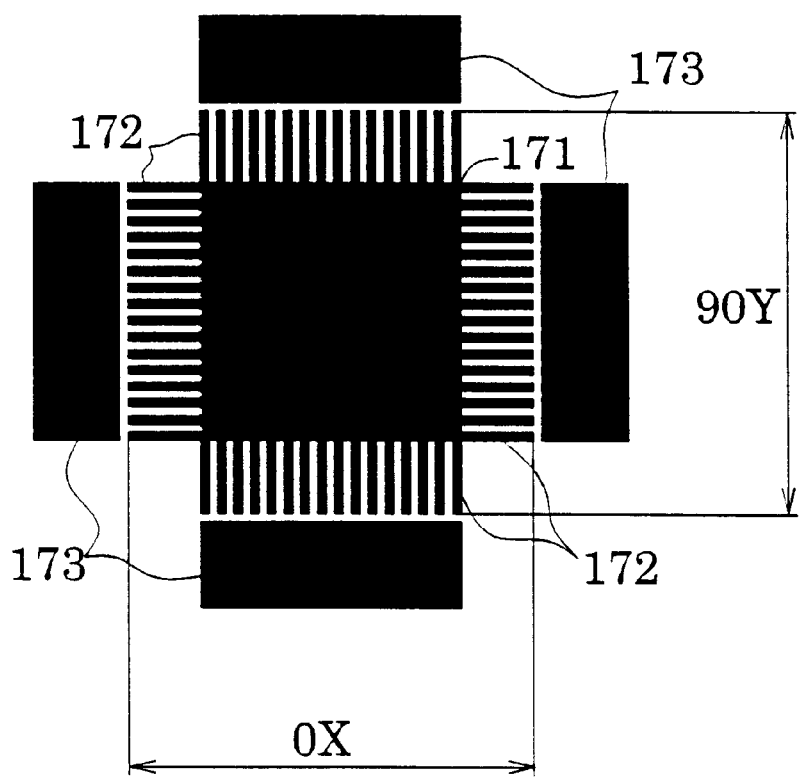
FIG. 14 illustrates the pattern configuration achieved in a thirteenth embodiment of the present invention.

FIG. 14 illustrates the pattern configuration achieved in the thirteenth embodiment of the present invention. The pattern configuration in FIG. 14 is achieved by joining line-and-space patterns 172 constituted as described in reference to the eleventh embodiment to a rectangular pattern 171 in four directions, i.e., up, down, left, and right and by providing rectangular patterns 173 at the outer sides of the line-and-space patterns 172 over a distance. This distance and the various dimensions are the same as those in the eleventh embodiment. The outermost dimensions of the line-and-space patterns 172, i.e., 0X and 90Y, are set so that they are contained within the measurement field of view of the optical length measuring machine.

The pattern formed by transferring this pattern onto a wafer with a stepper is similar to that achieved in the eleventh embodiment. Namely, in the resulting pattern, a reduction in the film thickness has occurred in the line-and-space portions the front ends of the line-and-space portions have undergone changes in their dimensions and shapes sensitively in response to changes in the exposure condition of the stepper or aberrations and the pattern outer edges in the measurement field of view of the optical length measuring machine achieve a linear pattern shape, thereby enabling measurement of various dimensions by using the optical length measuring machine. In addition, the shapes of the front ends of the line-and-space patterns are less readily affected by coma aberrations or the like. The dimensions of the pattern that has been formed corresponding to 0X and 90Y in FIG. 14 are measured with the optical length measuring machine to calculate an astigmatism as follows:

0 degree–90 degrees direction astigmatism=(0X)–(90Y)

Thus, in this embodiment, too, the 0 degree–90 degrees direction astigmatism can be measured with a high degree of sensitivity with the optical length measuring machine without being greatly affected by coma aberrations or the like. By distributing this pattern over the entire lens exposure range, the astigmatism can be evaluated for the entire lens exposure range. In addition, the outermost dimensions of the pattern configuration are set so that they are contained within the measurement field of view of the optical length measuring machine. Thus, the same pattern can be used to measure dimensions in the two directions, i.e., the 0 degree direction and the 90 degrees direction, to achieve an improvement in the work efficiency.

Figure 15:
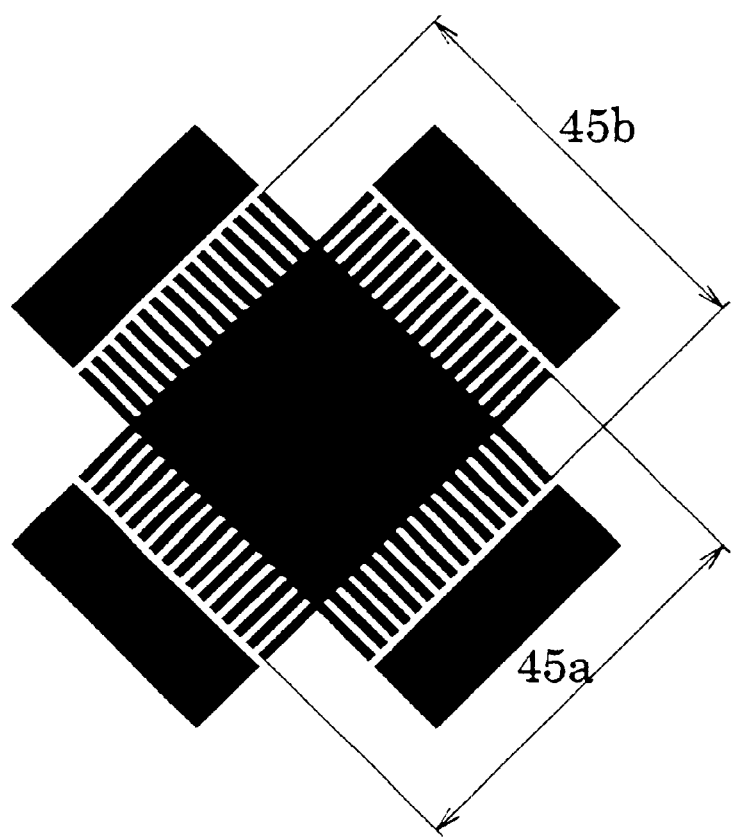
FIG. 15 illustrates the pattern configuration achieved in a fourteenth embodiment of the present invention.

FIG. 15 illustrates the pattern configuration in the fourteenth embodiment of the present invention. The pattern configuration in FIG. 15 is achieved by rotating the pattern configuration shown in FIG. 14 by 45 degrees. The pattern formed by transferring this pattern onto a wafer with a stepper is similar to that achieved in the eleventh embodiment. Namely, in the resulting pattern, a reduction in the film thickness has occurred in the line-and-space portions, the front ends of the line-and-space portions have undergone changes in their dimensions and shapes sensitively in response to changes in the exposure condition of the stepper or aberrations and the pattern outer edges in the measurement field of view of the optical length measuring machine achieve a linear pattern shape, thereby enabling measurement of various dimensions by using the optical length measuring machine. In addition, the shapes of the front ends of the line-and-space patterns are less readily affected by coma aberrations or the like. The dimensions of the pattern that has been formed corresponding to 45*a* and 45*b* in FIG. 15 are measured with the optical length measuring machine to calculate an astigmatism as follows:

45 degrees direction astigmatism=(45*a*)−(45*b*)

Thus, in this embodiment, too, the 45 degrees direction astigmatism can be measured with a high degree of sensitivity with the optical length measuring machine without being greatly affected by coma aberrations or the like, as in the eleventh embodiment. By distributing this pattern over the entire lens exposure range, the astigmatism can be evaluated for the entire lens exposure range. In addition, the outermost dimensions of the pattern configuration are set so that they are contained within the measurement field of view of the optical length measuring machine. Thus, the same pattern can be used to measure dimensions in the two directions to achieve an improvement in the work efficiency. By adopting this embodiment in combination with the thirteenth embodiment, astigmatism in two directions can be evaluated at a single exposure position.

Figure 16:
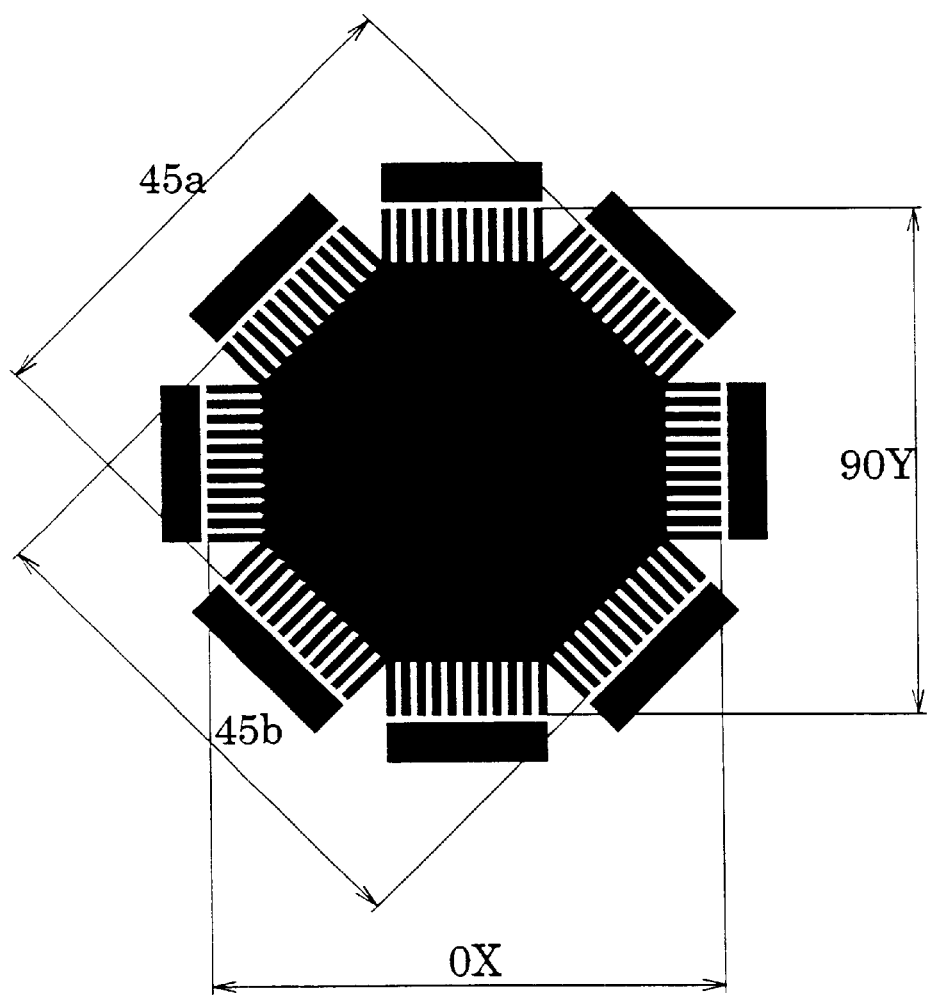
FIG. 16 illustrates the pattern configuration achieved in a fifteenth embodiment of the present invention.

FIG. 16 illustrates the pattern configuration achieved in the fifteenth embodiment of the present invention. The pattern configuration in FIG. 16 is achieved by joining line-and-space patterns 192 constituted as described in reference to the eleventh embodiment at the individual edges of an octagonal pattern 191 in the eight directions and provided rectangular patterns 193 at the outer sides of the line-and-space patterns 192 over a distance. This distance and the various dimensions are the same as those in the eleventh embodiment. The outermost dimensions of the line-and-space patterns 192 are set so that they are contained within the measurement field of view of the optical length measuring machine.

The pattern formed by transferring this pattern onto a wafer with a stepper is similar to that achieved in the eleventh embodiment. Namely, in the resulting pattern, a reduction in the film thickness has occurred in the line-and-space portions, the front ends of the line-and-space portions the front ends of the line-and-space portions have undergone changes in their dimensions and shapes sensitively in response to changes in the exposure condition of the stepper or aberrations and the pattern outer edges in the measurement field of view of the optical length measuring machine achieve a linear pattern shape, thereby enabling measurement of various dimensions by using the optical length measuring machine. The shapes of the front ends of the line-and-space patterns are less readily affected by coma aberrations or the like. The dimensions of the pattern that has been formed corresponding to 0X, 90Y, 45*a* and 45*b* in FIG. 16 are measured with the optical length measuring machine to calculate astigmatism as follows:

0 degree−90 degrees direction astigmatism=(0X)−(90Y)

45 degrees direction astigmatism=(45*a*)−(45*b*)

four-way astigmatism=MAX ((0X), (90Y), (45*a*), (45*b*))−MIN ((0X), (90Y), (45*a*), (45*b*))

Thus, in this embodiment, too, astigmatism can be measured with a high degree of sensitivity with the optical length measuring machine, without being greatly affected by coma aberrations or the like as in the eleventh embodiment. By distributing this pattern over the entire lens exposure range, the astigmatism can be evaluated for the entire lens exposure range. Also, in this embodiment, by setting patterns in the eight directions, the three different types of astigmatism evaluation are enabled using a single pattern configuration. In addition, the dimensions of the pattern configuration are set so that the structure is contained within the measurement field of view of the optical length measuring machine. Thus, the same pattern can be used to measure dimensions in four directions to achieve an improvement in the work efficiency.

Figure 17:
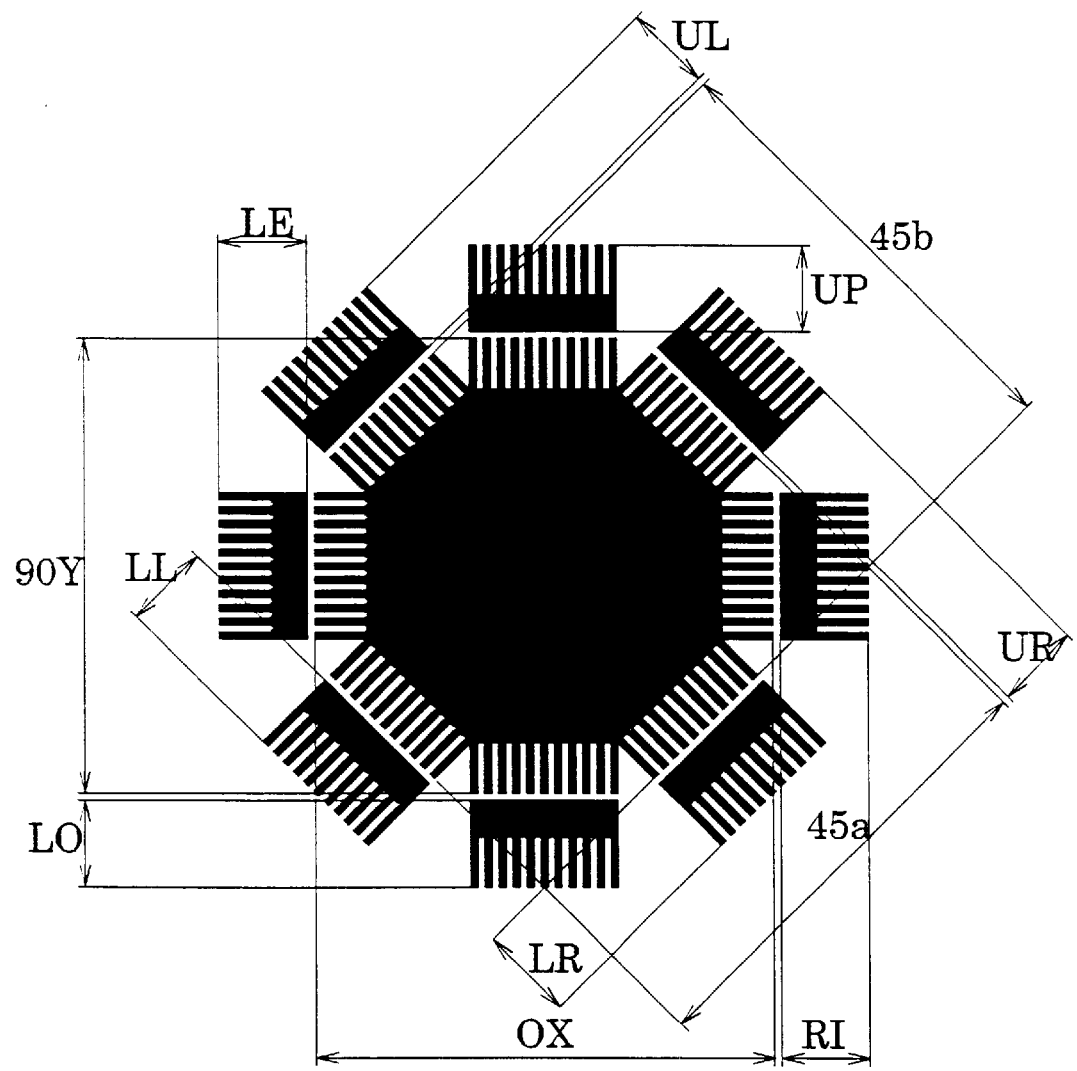
FIG. 17 illustrates the pattern configuration achieved in a sixteenth embodiment of the present invention.

FIG. 17 illustrates the pattern configuration achieved in the sixteenth embodiment of the present invention. The pattern configuration in FIG. 17 is achieved by further joining line-and-space patterns at the outer sides of the rectangular patterns in the pattern configuration shown in FIG. 16. These additional line-and-space patterns have the same dimensions and shapes as the line-and-space patterns provided on the inner sides of the rectangular patterns, and are set in the eight directions.

The pattern formed by transferring this pattern onto a wafer with a stepper is similar to that achieved in the previous embodiment. Namely, in the resulting pattern, a reduction in the film thickness has occurred in the line-and-space portions, the front ends of the line-and-space portions have undergone changes in their dimensions and shapes sensitively in response to changes in the exposure condition of the stepper or aberrations and the pattern outer edges in the measurement field of view of the optical length measuring machine achieve a linear pattern shape, thereby enabling measurement of various dimensions by using the optical length measuring machine. In addition, the shapes of the front ends of the line-and-space patterns bonded with the octagonal patterns are less readily affected by coma aberrations or the like. As in the previous embodiment, the dimensions of the pattern that has been formed corresponding to 0X, 90Y, 45*a* and 45*b* in FIG. 17 are measured with the optical length measuring machine to calculate dimensional differences as astigmatism. By measuring the dimensions in the pattern that has been formed corresponding to UP, UR, RI, LR, LO, LL, LE and UL in FIG. 17 with the optical length measuring machine and calculating the dimensional differences, coma aberrations can be ascertained.

Thus, by adopting this embodiment, coma aberrations in four directions and astigmatism in two directions can be evaluated with a high degree of sensitivity with the optical length measuring machine using a single pattern configuration in the embodiment. In addition, the astigmatism measurement can be performed without being greatly affected by coma aberrations and the like. By distributing this pattern over the entire lens exposure range, coma aberrations and astigmatism can be evaluated for the entire lens exposure range. Furthermore, by setting the dimensions of the pattern configuration so that the pattern structure can be contained within the measurement field of view of the optical length measuring machine, dimensional measurement in the four directions to ascertain coma aberrations and the dimensional measurement to ascertain astigmatism in four directions can be achieved at the same time using the same pattern, thereby achieving an improvement in the work efficiency.

Figure 18A:
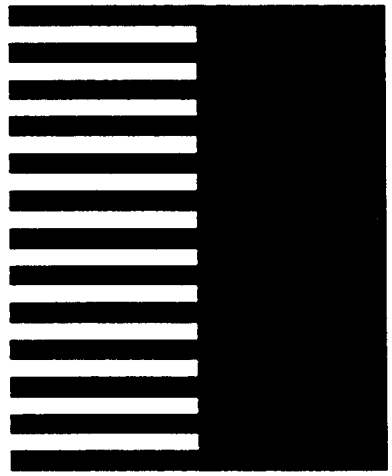
FIG. 18 illustrates the pattern shape achieved in a seventeenth embodiment of the present invention.
Figure 18A:
Figure 18B:
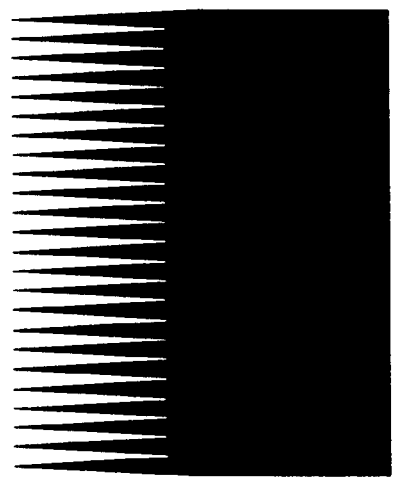

FIG. 18(a) shows the joint pattern achieved by joining a rectangular pattern and a line-and-space pattern explained in reference to the previous embodiments. FIG. 18(b) illustrates the pattern achieved in the seventeenth embodiment of the present invention. The pattern in FIG. 18(b) is achieved by replacing the line-and-space pattern in FIG. 18(a) with a repetitious pattern of an isosceles triangle so that the pattern forms a wedge shape as illustrated in the figure. The length of the base of the isosceles triangle is set at a dimension that does not allow separation/resolution when the pattern is transferred onto a wafer with the stepper or at a dimension that may allow separation/resolution but does not allow the individual pattern edges to appear separated/resolved on the optical length measuring machine employed for dimensional measurement. The length of the isosceles triangle along the direction of its height is set at several micrometers to ensure that the isosceles triangle portions are present in the pattern formed through transfer even if the pattern shape has changed due to a change in the exposure condition.

The pattern achieved by transferring any of the patterns achieved by replacing the wedge portions in the previous embodiment with the wedge-shaped pattern shown in FIG. 18(b) with a stepper is similar to those achieved in the previous embodiments. Namely, in the resulting pattern, a reduction in the film thickness has occurred in the wedge portions, the front ends of the wedge portions have undergone changes in their dimensions and shapes sensitively in response to changes in the exposure condition of the stepper or aberrations and the pattern outer edges in the measurement field of view of the optical length measuring machine achieve a linear pattern shape, thereby enabling measurement of various dimensions by using the optical length measuring machine. Thus, similar advantages to those achieved in the embodiments using the line-and-space patterns explained earlier are realized in this embodiment as well.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

As explained above in detail, according to the present invention, a stepper lens aberration measurement pattern that makes it possible to quickly measure stepper lens aberrations with a high degree of sensitivity using an optical length measuring machine is provided.

The entire disclosure of Japanese Patent Application No. 11-250468 filed on Sep. 3, 1999 including specification, claims, drawings and summary is incorporated herein by reference in its entirety.

What is claimed is:

1. A pattern to be utilized for stepper lens aberration characteristics evaluation, comprising a plurality of joint pattern sets respectively rotated by an equal angle one to the next, each joint pattern set including one or more joint pattern pairs, each joint pattern pair including a pair of joint patterns positioned a distance from each other, each joint pattern constituted of a line-and-space type first pattern and a roughly rectangular second pattern, joined in a rough comb shape, the first pattern the first pattern constituted of a plurality of line patterns each having a width along the direction of the shorter side thereof set at a dimension that does not allow separation/resolution on a field of view of an optical length measuring machine, the second pattern having external dimensions that allow separation/resolution in the field of view of said optical length measuring machine, the distance from each other of the joint patterns of each joint pattern pair being set so as to allow separation/resolution in the field of view of the optical length measuring machine with line portions of said first patterns extending outward and achieving a symmetrical positional relationship with each other.

2. A pattern to be utilized for stepper lens aberration characteristics evaluation according to claim 1, wherein:
said line patterns are each formed in a rough wedge shape with the width at the base thereof along the direction of the shorter side thereof set to a dimension that does not allow separation/resolution in the field of view of said optical length measuring machine.

3. A pattern to be utilized for stepper lens aberration characteristics evaluation according to claim 1, wherein:
the width of said line patterns along the direction of the shorter side thereof is set equal to or smaller than the resolution limit of the stepper.

4. A pattern having pluralities of first and second patterns, to be utilized for stepper lens aberration characteristics evaluation, comprising:
a plurality of pattern sets respectively rotated by an equal angle one to the next, each pattern set including a joint pattern set and a third pattern, wherein
the joint pattern set is constituted of one or more joint pattern pairs,
each joint pattern pair is constituted of at least two joint patterns, each joint pattern including a line-and-space type first pattern and a roughly rectangular second pattern,
each first pattern is constituted of a plurality of line patterns each having a width along the direction of the shorter side thereof set at a dimension that does not allow separation/resolution on a field of view of an optical length measuring machine,
each second pattern has external dimensions that allow separation/resolution in the field of view of said optical length measuring machine, the first and second patterns of each joint pattern being joined in a rough comb shape,
the joint patterns of each joint pattern pair are positioned over a distance from each other set to a dimension that allows separation/resolution in the field of view of said optical length measuring machine with line portions of said first patterns extending outward and achieving a symmetrical positional relationship with each other, and
the third pattern has external dimensions that allow separation/resolution in the field of view of said optical length measuring machine and has sides parallel to the inner side of each of the second patterns in said joint pattern set, said third pattern being disposed in an inner space enclosed by said second patterns in said joint pattern set over a distance from said second patterns that allows separation/resolution by the optical length measuring machine with sides of said third pattern extending parallel to the inner sides of said second patterns.

5. A pattern to be utilized for stepper lens aberration characteristics evaluation according to claim 4, wherein:
said line patterns are each formed in a rough wedge shape with the width at the base thereof along the direction of the shorter side thereof set to a dimension that does not allow separation/resolution in the field of view of said optical length measuring machine.

6. A pattern to be utilized for stepper lens aberration characteristics evaluation according to claim 4, wherein:

the width of said line patterns along the direction of the shorter side thereof is set equal to or smaller than the resolution limit of the stepper.

7. A pattern to be utilized for stepper lens aberration characteristics evaluation, comprising:

a plurality of pattern sets respectively rotated by an equal angle one to the next, each pattern set including a line-and-space type first pattern constituted of a plurality of line patterns each having a width along the direction of the shorter side thereof set at a dimension that does not allow separation/resolution on a field of view of an optical length measuring machine, and a roughly rectangular pattern having external dimensions that allow separation/resolution in the field of view of said optical length measuring machine; and a second pattern having external dimensions that allow separation/resolution in the field of view of said optical length measuring machine and having sides facing opposite each other extending parallel to each other, wherein the first pattern of each pattern set has a rear side at rear ends of the line portions thereof measured along the direction of the length of the line portions, and a front side at front ends of the line portions located opposite the rear ends, the rear side of respective first patterns of the pattern sets being joined to said second pattern at at least two sides of said second pattern facing opposite each other, the roughly rectangular pattern of each pattern set being positioned over a distance from the front side of the first pattern thereof that allows separation/resolution in the field of view of said optical length measuring machine.

8. A pattern to be utilized for stepper lens aberration characteristics evaluation according to claim 7, wherein:

said line patterns are each formed in a rough wedge shape with the width at the base thereof along the direction of the shorter side thereof set to a dimension that does not allow separation/resolution in the field of view of said optical length measuring machine.

9. A pattern to be utilized for stepper lens aberration characteristics evaluation according to claim 7 wherein:

the width of said line patterns along the direction of the shorter side thereof is set equal to or smaller than the resolution limit of the stepper.

10. A pattern to be utilized for stepper lens aberration characteristics evaluation, comprising:

a plurality of pattern sets respectively rotated by an equal angle one to the next, each pattern set including an inner line-and-space type pattern constituted of a plurality of line patterns each having a width along the direction of the shorter side thereof set at a dimension that does not allow separation/resolution on a field of view of an optical length measuring machine, a roughly rectangular pattern having inner and outer sides and having external dimensions that allow separation/resolution in the field of view of said optical length measuring machine, and an outer line-and-space type pattern constituted of a plurality of line patterns each having a width along the direction of the shorter side thereof set at a dimension that does not allow separation/resolution on a field of view of an optical length measuring machine; and a central pattern having external dimensions that allow separation/resolution in the field of view of said optical length measuring machine and having sides facing opposite each other extending parallel to each other, wherein the inner line-and-space type pattern of each pattern set has a rear side at rear ends of the line portions thereof measured along the direction of the length of the line portions, and a front side at front ends of the line portions located opposite the rear ends, the rear side of respective inner line-and-space type patterns of the pattern sets being jointed to said central pattern at at least two sides of said central pattern facing opposite each other, the roughly rectangular pattern of each pattern set being positioned with its inner side over a distance from the front side of the first pattern thereof that allows separation/resolution in the field of view of said optical length measuring machine, and with its outer side joined to the outer line-and-space type pattern of said each pattern set.

11. A pattern to be utilized for stepper lens aberration characteristics evaluation according to claim 10, wherein:

said line patterns are each formed in a rough wedge shape with the width at the base thereof along the direction of the shorter side thereof set to a dimension that does not allow separation/resolution in the field of view of said optical length measuring machine.

12. A pattern to be utilized for stepper lens aberration characteristics evaluation according to claim 10, wherein:

the width of said line patterns along the direction of the shorter side thereof is set equal to or smaller than the resolution limit of the stepper.

* * * * *